United States Patent [19]

Limpaecher

[11] Patent Number: 5,764,501

[45] Date of Patent: *Jun. 9, 1998

[54] COMPACT AND EFFICIENT POWER TRANSFER SYSTEM AND METHOD

[75] Inventor: Rudolf Limpaecher, Topsfield, Mass.

[73] Assignee: D.C. Transformation, Inc., Beverly, Mass.

[*] Notice: The term of this patent shall not extend beyond the expiration date of Pat. Nos. 5,270,913, 5,351,419 and 5,561,597.

[21] Appl. No.: 466,102

[22] Filed: Jun. 6, 1995

Related U.S. Application Data

[63] Continuation of Ser. No. 323,514, Oct. 14, 1994, Pat. No. 5,561,597, which is a continuation of Ser. No. 121,693, Sep. 15, 1993, Pat. No. 5,357,419, which is a continuation of Ser. No. 864,031, Apr. 6, 1992, Pat. No. 5,270,913.

[51] Int. Cl.$^6$ .................................................. H02M 7/758
[52] U.S. Cl. .............................. 363/61; 363/62; 363/140
[58] Field of Search .............................. 363/59, 60, 61, 363/62, 63, 140; 307/109, 110; 320/1

[56] References Cited

U.S. PATENT DOCUMENTS

| | | | |
|---|---|---|---|
| 3,366,799 | 1/1968 | Fitch | 363/59 |
| 3,663,940 | 5/1972 | Schwarz | 363/28 |
| 3,743,914 | 7/1973 | Holz | 320/1 |
| 3,808,512 | 4/1974 | Sakka | 363/62 |
| 3,839,666 | 10/1974 | Kitaev | 363/60 |
| 3,849,717 | 11/1974 | Walz et al. | 363/61 |
| 4,274,134 | 6/1981 | Johannessen | 363/59 |
| 4,523,269 | 6/1985 | Baker et al. | 307/110 |
| 4,636,930 | 1/1987 | Bingham et al. | 363/60 |
| 4,642,476 | 2/1987 | Honig | 363/138 |
| 4,649,468 | 3/1987 | Cubbison | 363/62 |
| 4,675,795 | 6/1987 | Takamura et al. | 363/61 |
| 4,797,899 | 1/1989 | Fuller et al. | 307/110 |
| 4,807,104 | 2/1989 | Floyd et al. | 363/59 |
| 4,812,613 | 3/1989 | Essaff et al. | 363/63 |
| 5,270,913 | 12/1993 | Limpaecher | 363/140 |
| 5,357,419 | 10/1994 | Limpaecher | 363/140 |
| 5,561,597 | 10/1996 | Limpaecher | 363/59 |

FOREIGN PATENT DOCUMENTS

| | | | |
|---|---|---|---|
| A-2-104 737 | 3/1983 | European Pat. Off. | H02M 3/04 |
| A-20 52 382 | 4/1972 | Germany | H02M 3/32 |
| 1087933 | 10/1961 | United Kingdom . | |
| 975911 | 5/1962 | United Kingdom . | |
| 988777 | 1/1963 | United Kingdom . | |
| 988778 | 1/1963 | United Kingdom . | |
| 1161347 | 10/1967 | United Kingdom . | |

OTHER PUBLICATIONS

Crouch et al., "A Compact High Speed Low Impedance Blumlein Line for High Voltage Pulse Shaping", The Review of Scientific Instruments, vol. 43, No. 4, Apr. 1972, pp. 632–637.

Kuffel et al., "High–Voltage Engineering", Applied Electricity and Electronics, Pergamon Press, Dec. 1984, pp. 12–23, 64–79.

(List continued on next page.)

*Primary Examiner*—Jeffrey L. Sterrett
*Attorney, Agent, or Firm*—Fish & Richardson P.C.

[57] ABSTRACT

An electrical power transfer apparatus for connecting to a multiphase power line carrying a AC signal having a period of $T_{AC}$, the apparatus including: a capacitive storage circuit; a plurality of charge transfer circuits connected to the capacitive storage circuit and each of which is connected to a different phase of the multiphase power line, wherein during operation the charge transfer circuits resonantly transfer power to and from the multiphase power line and capacitive storage circuit, wherein the resonant transfers to and from the capacitive charge storage circuit occur with a resonant frequency at least as great as $1/T_{AC}$; and a control circuit coupled to the plurality of charge transfer circuits and which during operation causes the plurality of charge transfer circuits to transfer power between different phases of the multiphase power line via the capacitive storage circuit.

18 Claims, 12 Drawing Sheets

OTHER PUBLICATIONS

Von Bermann, "Photo–Preionization Stabilized High–Pressure Glow–Discharge Lasers", University of Natal, Dec. 1980, Ph.D. Thesis, pp. 90–99, 176–178.

Skeist et al., "Recent Advances in High Power, High Voltage Technology", The Power Sources Conference, Dec. 1984.

Malesani et al., "Active Power Filter with Hybrid Energy Storage", IEEE, vol. 6, No. 3, Jul. 1991, pp. 392–397.

Bellar et al., "Analysis of the Dynamic and Steady–State Performance of Cockcroft–Walton Cascade Rectifiers", IEEE, vol. 7, No. 3, Jul. 1992, pp. 526–534.

Joos et al., "Performance Analysis of a PWM Inverter VAR Compensator", IEEE, vol. 6, No. 3, Jul. 1991, pp. 380–391.

Klaassens et al., "Three–Phase AC–to–AC Series–Resonant Power Converter with a Reduced Number of Thyristors" IEEE, vol. 6, No. 3, Jul. 1991, pp. 346–355.

Wernekinck et al., "A High Frequency AC/DC Converter with Unity Power Factor and Minimum Harmonic Distortion", IEEE, vol. 6, No. 3, Jul. 1991, pp. 364–370.

Redl et al., "A Novel Soft–Switching Full–Bridge DC/DC Converter: Analysis, Design Considerations, and Experimental Results at 1.5 kW, 100 kHz", IEEE, vol. 6, No. 3, Jul. 1991, pp. 408–418.

Fitch et al., Novel Principle of Transient High Voltage Generation: Proceedings, vol. 111, Apr. 1964, pp. 849–855.

Fitch, "Mark—and Mark Like—High Voltage Generators," Maxwell Laboratories, Inc., pp. 190–198 (Dec. 1970).

| PART | + IN<br>+ OUT | + IN<br>- OUT | - IN<br>+ OUT | - IN<br>- OUT | No. |
|---|---|---|---|---|---|
| SCR1 | X | X,Y |  | Y | 81 |
| SCR2 | Y |  | X,Y | X | 82 |
| SCR3 | X | X,Y |  | Y | 83 |
| SCR4 | Y |  | X,Y | X | 84 |
| SCR5 | X |  | X,Y | Y | 85 |
| SCR6 | Y | X,Y |  | X | 86 |
| SCR7 | X |  |  | Y | 87 |
| SCR8 |  | X,Y |  |  | 88 |
| SCR9 |  |  | X,Y |  | 90 |
| SCR10 | Y |  |  | X | 91 |

X=STEP-UP     Y=STEP-DOWN

FIG. 12 VAR SEQUENCE

| OPERATION | SWITCH | Vin/Vm | Vph/Vm | Vf/Vm | ΔQ/CVm | ΔE/E0 |
|---|---|---|---|---|---|---|
| 1. Phase 2 charging | SCR4 | 0.00 | -0.707 | -1.414 | +1.414 | -1.000 |
| 2. Phase 3 discharging | SCR5 | -1.414 | -0.259 | +0.897 | -2.311 | +0.598 |
| 3. Phase 2 charging | SCR4 | +0.897 | -0.707 | -2.311 | +3.207 | -2.268 |
| 4. Phase 3 discharging | SCR5 | -2.311 | -0.259 | +1.793 | -4.104 | +1.062 |
| 5. Phase 1 discharging | SCR2 | +1.793 | +0.966 | +0.139 | +1.654 | +1.598 |
| 6. Phase 2 charging | SCR4 | +0.139 | -0.707 | -1.553 | +1.692 | -1.196 |
| 7. capacitor inverting | SCR14 | -1.553 | 0.00 | +1.553 | 0.00 | 0.00 |
| 8. Phase 1 discharging | SCR2 | +1.553 | +0.966 | +0.379 | +1.174 | +1.134 |
| 9. Phase 2 charging | SCR4 | +0.379 | -0.707 | -1.553 | +1.692 | -1.196 |

FIG. 13 VAR RESULT

| OPERATION | ΔQt/CVm | Ir Δt | ΔEt/E0 | PrΔt/E0 |
|---|---|---|---|---|
| Phase 1 | +1.654 | +1.691 | +1.598 | +1.634 |
| Phase 2 | +4.622 | +4.620 | -3.268 | -3.268 |
| Phase 3 | -6.415 | -6.311 | +1.660 | +1.634 |
| TOTAL | -0.139 | 0.00 | -0.010 | 0.00 |
| RESIDUAL | +0.139 | | 0.010 | |

COMPACT AND EFFICIENT POWER TRANSFER SYSTEM AND METHOD

CROSS-REFERENCE TO RELATED PATENT APPLICATIONS

This is a continuation of U.S. patent application Ser. No. 08/323,514 filed Oct. 14, 1994, now issued as U.S. Pat. No. 5,561,597, which is a continuation of U.S. patent application Ser. No. 08/121,693 filed Sep. 15, 1993, now issued as U.S. Pat. No. 5,357,419, which is a continuation of U.S. patent application Ser. No. 07/864,031, filed Apr. 6, 1992 now issued as U.S. Pat. No. 5,270,913.

BACKGROUND OF THE INVENTION

Disclosed is a new Transformerless Power Conversion System (TPCS) that allows a direct voltage step-up or step-down of DC or AC power without the use of magnetic core transformers. The operation is accomplished with solid state switching devices, capacitors, preferentially air core inductors and a switch control system.

The conversion and step-up from AC to DC and the inverse process can be implemented with high efficiency and without the generation of harmonics. The transformer elimination in conjunction with high inversion frequency operation results in a low weight system without transformer core losses and third harmonic generation. For high ratio DC to DC transformation the TPCS transports the input charge directly to the output without requiring an AC link. The three distinct operations of charging, transformation, and energy discharge are typically in sequential order and allows a complete isolation between the input and output power grids. The TPCS allows complete power flow control and with it allows an improvement of power grid stability. A number of integrated TPCS modules can be configured to perform in a single system as a voltage transformation stage, a power converter or inverter, an output regulator, an AC phase angle corrector as well as a fast power interruption device.

The architecture is specifically suited for high voltage DC power distribution systems with AC to DC conversion and step-up at the power station for HVDC transmission; DC to DC step down for DC distribution in place of AC; and final DC to polyphase AC power conversion near the bulk power consumers.

SUMMARY OF THE INVENTION

This invention relates to transformerless power conversion system that allows voltage transformation of either DC or AC, conversion of AC to DC or inversion of DC to AC. The system allows voltage step-up or step-down of either AC or DC without the use of a transformer. In combination with the appropriate control logic and solid state switching devices, highly regulated output can be obtained at Megawatt power level with an efficiency equivalent to that of unregulated standard AC power transformations.

DC-DC Transformation

In the prior art for DC to DC step-up the DC needed to be first converted to high frequency AC. The voltage transformation was then performed with a transformer and the AC was then converted back to DC. The transformer not only adds to the system weight but is the major contributor or the reduction of efficiency. In addition scaling to high power and high voltages of the order of 100 KV is impractical. With my invention the input charge is directly transported to the output with an efficient intermediate electrical voltage transformation process. No AC to AC transformation is required. Transformers with its demanding volt-second scaling, magnetic core losses, cost, weight, and large volume requirement are completely eliminated.

AC-AC Transformation

The standard AC power distribution system is based on the voltage transformation capability of iron core transformers operating typically at a low frequency of 50 or 60 Hz. These devices are large, costly, and have a constant voltage transfer ratio given by the turns ratio. My invention eliminates the transformer and all its constraints on the AC power distribution system by transporting the input power electrostatically to the output with simultaneous regulation capability.

AC System Interconnection

To interconnect two independent and unsynchronized power systems it is presently necessary to convert the AC to DC and back to AC with the correct phase and frequency. My invention allows the direct transfer of power from one polyphase system to a second polyphase system without the use of a DC link. I must emphasize that the DC to DC link interconnection benefits of power grid for stabilization is retained with my TPCS AC to AC transformation interconnection.

The prior art of high power polyphase AC rectification results in substantial production of harmonics on to the AC input. The required harmonic filtering contributes appreciably to the power distribution cost. With my invention the AC to DC transformation and step-up eliminates the transformer and the harmonics filtering. By operating at a high TPCS frequency only small filters are required at the AC input and DC output.

DC Power Distribution

To clear a high voltage DC line fault the present art requires the shut-down of the complete DC line on the converter AC input end. As a result DC lines are presently only economically viable for long distance point to point power transport and for independent system interconnection. In contrast my invention allows the implementation of a complete DC distribution with direct DC to DC step-down with the elimination of all the problems associated with the AC distribution system. Faults on a DC branch line can be simply cleared by momentarily stopping the inversion process. Disconnect switches can then be opened or closed under no load conditions.

Variable Output Frequency

The prior art of variable output frequency is complex and costly to implement. The cycloconverter is a high power control system that can directly convert AC polyphase power from high frequency to lower frequency. If a 60 Hz source is used, the cycloconverter output frequency is typically variable from zero to 10 Hz with the higher end of the frequency spectrum limited to about 40% of the supply frequency. The resulting low-frequency wave is composed of segments of the original source frequency. The output voltage can be made to approach a sine wave quite closely. However large reactive power and harmonics are generated. In addition the output voltage is limited.

In contrast my invention allows the efficient generation of output with variable frequency and variable voltage. The controlled output frequency may be higher or lower than the frequency of the power source. The same statement applies for the output voltage control. Most importantly my TPCS variable frequency/voltage controller does not generate harmonics, input waveform distortion or reactive power. In addition the output frequency, the output phase, and output power can be controlled at an efficiency similar to that of a AC power transformer. The phase rotation can be changed on a subcycle time period with controlled voltage output for optimum start-up, torque control or speed control of induction motors. Furthermore an efficient variable frequency converter can be also run with straight DC input with equal efficiency and performance.

Reactive Power Regulator and Harmonic Filters

TPCS modules can be configured as a fast response phase angle correction system and reactive power regulator (VARG) as part of the voltage transformation system or as a separately stand alone unit. With the fast TPCS operating characteristics such a VARG can respond on the time scale of a fraction of an AC cycle. Not only can my invention regulate the reactive power flow continuously from zero to its maximum rating but also can respond to both leading and lagging phase angle correction requirement.

The phase angle correction is performed without generating either harmonics or phase distortion. For balanced polyphase grids my VAR configuration does not require the storage of energy for large duration of a cycle as is normally required for most operating systems. My VARG has similar 'black box' characteristics as a Synchronous Motor, running without a mechanical load. The major difference is that TPCS VARG has no moving part, is much more economical to run, has much higher efficiency, and can response in a faster time-scale.

The TPCS VARG operational characteristics allow it to be programmed as a stand alone or as integrated Active Harmonic Filters (AHF), again with no substantial energy storage requirement. This operation is possible since TPCS can extract the reactive and harmonic power (or charge) from the low voltage part of an AC cycle and can reinject it into another phase that has a high voltage. The TPCS VARG/AHF can be programmed to neutralize several harmonic frequencies simultaneously. My invention allows the elimination of the large capacitor and reactor energy storage as is the state-of-the-art approach as described by Malesani at all (Active Power Filter with Hybrid Energy Storage, in IEEE Trans.on Power Electronics. Vol. 6 No. 3, July 1991).

With the present state-of-the-art of either AC to DC rectification or AC load control, passive or active filtering are required to neutralize the generated harmonics. The TPCS on the other hand can perform this function as efficiently without producing harmonic distortions on the AC input grid.

If harmonics and reactive power is generated by non-linear and reactive AC loads the TPCS "transformer" is powering, the TPCS can efficiently neutralize them as long as the harmonics are balanced on the AC output. The TPCS active harmonic filtering and reactive power generation is performed without large energy storage requirement in the form of either capacitor banks or large inductors. Furthermore the architecture of the TPCS harmonic filtering system is such that it can respond to the requirement of harmonic filtering level change in a fraction of a cycle.

BRIEF DESCRIPTION OF THE DRAWINGS

Other objects and features of my invention and of these embodiments thereof will be better understood from the following specification taken in conjunction with the annexed drawings of which:

FIG. 12 presents the parameters of a specific control sequence for a three phase TPCS VAR generator; and FIG. 13 presents a comparison of the result of a TPCS VAR generator sequence with that of theoretical requirements.

DESCRIPTION OF THE PREFERRED EMBODIMENT

Basic Architecture

Figure 1:
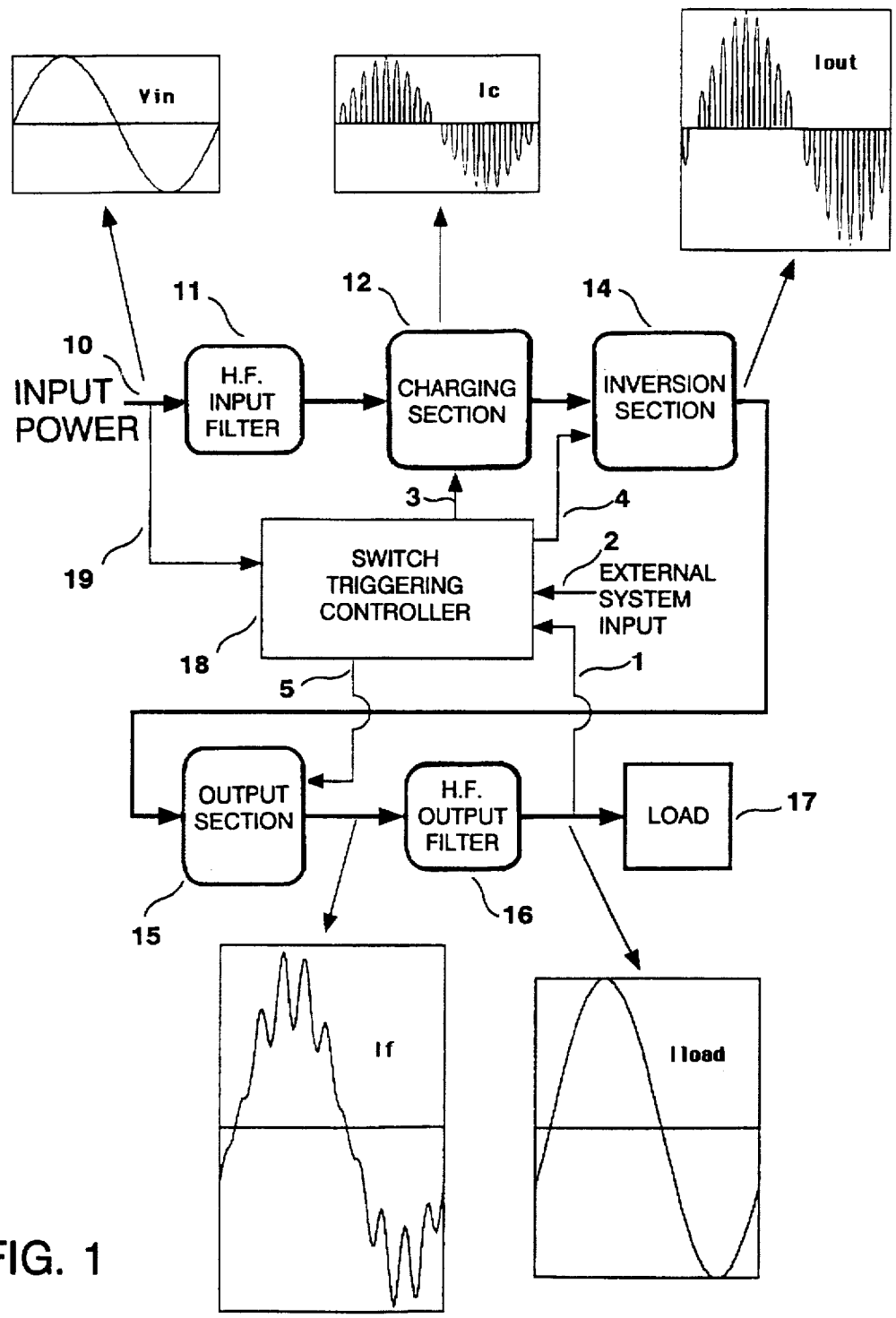
FIG. 1 is a representation of the basic TPCS architecture and some selected electrical waveforms for an AC to AC converter.

The following is a description of preferred embodiment of my invention. As a first example the transformation of AC to AC with no change of phase and/or frequency is described as schematically shown in FIG. 1. This basic architecture is equally applicable for AC voltage step-up as well as step-down. The details will become apparent with later descriptions.

To perform the described function with maximum power throughput, minimum system weight, minimum system volume and minimum electrical filtering requirement the system should be designed with an internal operating frequency significantly higher than the AC line frequency. An internal TPCS cycle typically consists of a charging period, an inversion cycle and a discharge period.

On the input end of the TPCS typically a high frequency filter 11 is used, this is followed by a charging section 12. The charging section controls the charging of a set of small high frequency low-loss capacitors and consists typically of switches and a series inductor. This will charge up the capacitor bank to twice of the instantaneous input voltage 10. The charging period is given by:

$$T_c = \pi\sqrt{(L_c \cdot C_{\mathit{eff}})}$$

where $L_c$ is the charging inductor and $C_{\mathit{eff}}$ is the effective value of the capacitor bank being charged. The capacitor bank is located in inversion section 14 and is the major component. With modern switching devices the capacitor bank may be fully or only partly charged.

Typically as soon as the charging switches have electrically recovered the internal TPCS capacitor bank becomes electrically isolated from the input and the inversion cycle is initiated. During the inversion cycle the electric polarity is inverted on some of the capacitors. The inversion cycle results in either a voltage step-up or step-down. The inversion cycle process, as described below, requires a similar time period as the charging cycle. The inversion process is completed with the voltage of a plurality (typically half) of the capacitors in the capacitor bank reversed.

The third and final period is the discharge cycle where the energy in the TPCS capacitor bank is discharged through the output section 15. With the use of a second high frequency filter 16 high frequency ripples from the TPCS operation are eliminated from the output. Again it is preferential to use an output inductor to control the output energy transfer, the discharge period, and to minimize the energy losses.

A critical component is the controller 18. It monitors both the input 10 and output 20 condition such as the input and output voltage, load level, and critical internal TPCS status condition and generates 22, 23, 24 the turn-on or gaiting of the switches.

Operating the TPCS at a high frequency a sine wave 20 output can be reconstructed with a minimum of input and output filtering. In addition the output voltage or power can be regulated in three primary ways.

1) By charging the capacitors to a predetermined level and controlling the TPCS cycle frequency the output voltage can be increased or decreased.
2) The second mode of control is to use a constant TPCS cycle frequency and achieve the control by regulating the input charging level.
3) Finally the above two modes can be combined.

The mode selection is subject to detailed component, system architecture and operational requirement trade-offs. It is understood that a plurality of modules, operating in parallel, may be integrated as one system. Such modules would be operated out of phase with each other to minimize the input and output filter requirements. In addition should a module become defective such an architecture could provide build in system redundancy.

FIG. 1 shows voltage and current waveforms at several points of the TPCS system. For clarity of illustration only 18 TPCS cycles per AC cycle are used. The sine input voltage Vin produces a charging current Ic having a sine envelop. The inversion section output current Iout has a similar shape but is shifted by one cycle in time. The output section produces a current If. Its internal operation is selected to cause some filtering. The fully filtered output reflects the sine wave input modified in amplitude by the controlled step-up or step-down ratio. In addition a phase-shift with a time period corresponding to a TPCS cycle is induced between the input and output. To limit the shift to one degree the TPCS would have to be operated at a frequency of 21.6 KHz for a 60 Hz application. This is well within the state-of-the-art of solid state devices or plasma switches such as the Crossatron.

DC to DC Step-Up Transformation

Figure 2:
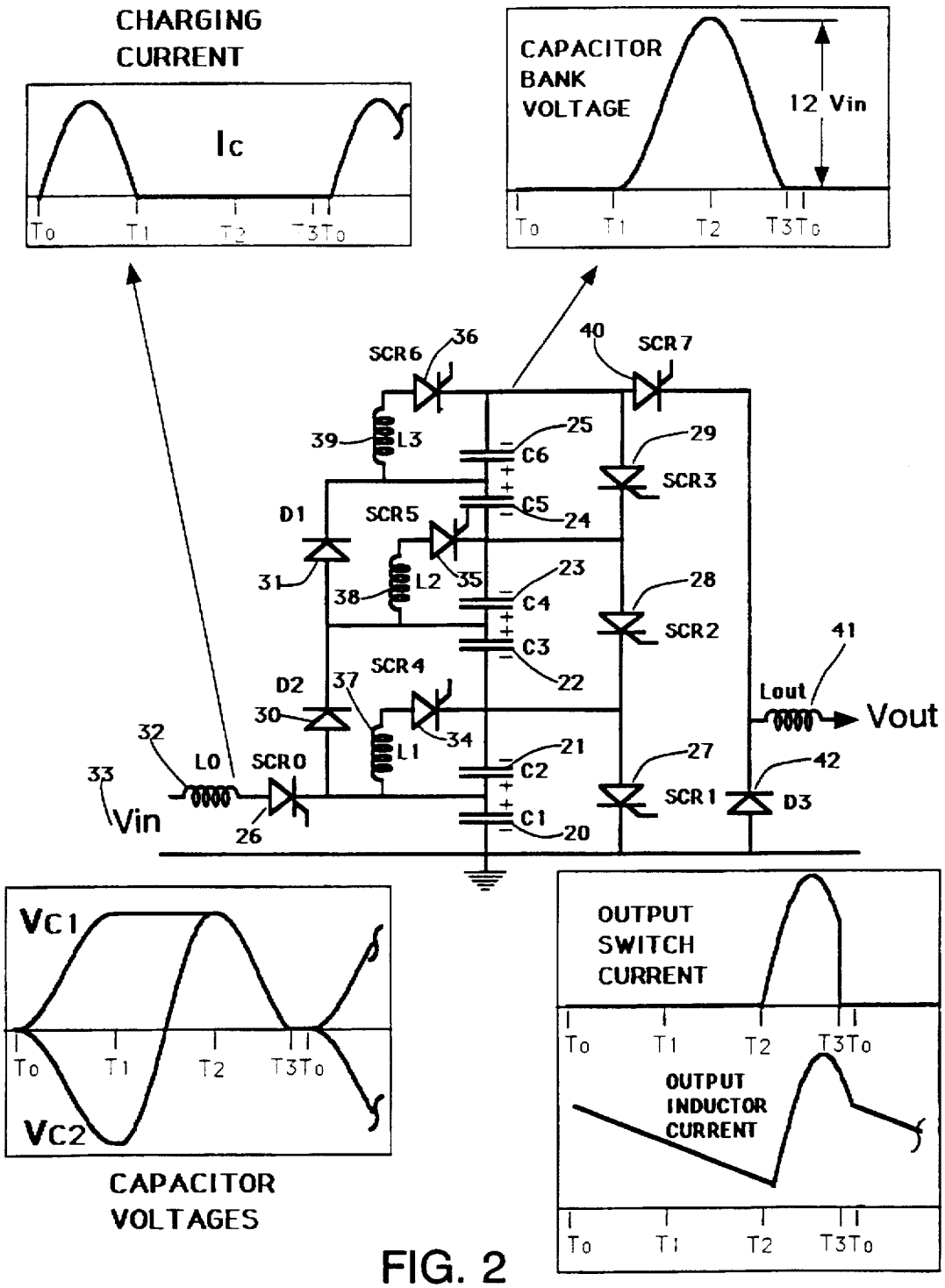
FIG. 2 is a typical three stage TPCS DC to DC voltage step-up transformation circuit.

Since DC to DC transformation has a low number of component counts and conceptually is one of the simplest TPCS applications I will use it to introduce the basic TPCS operation. FIG. 2 shows a simplified three stage DC voltage step-up circuit that was tested. The input filter, output filter, and control circuit are not shown for clarity.

Before going into the circuit and operational description I will review the state-of-the-art of DC to DC conversion. The basic principle of converters have not changed since its invention by Francis C. Schwarz. His work is described in U.S. Pat. No. 3,663,940 "Controllable Load Insensitive Power Converters"; Schwarz May 16, 1972. Most other inventions in this area are refinements and improvements on this classical work. The only feature our two inventions have in common is that both devices operate at high switching frequency and have a regulated output capability.

He first uses a switching circuit to produce AC from the DC input. The AC is then connected to the primary winding of a high frequency transformer. The transformer turns-ratio is then used to establish the basic voltage step-up or step-down ratio. Finally to produce DC the transformed AC is rectified and filtered to yield DC at the desired level.

The Schwarz converter has found many applications in the lower voltage range. The operation at high frequency reduced the transformer cross-section area, which scaled approximately inversely with the inversion frequency and directly with the output voltage. This transformer scaling, however, yields large transformer weight for application to higher voltage range with simultaneous reduction in the transformation efficiency.

With my invention the transformer and its disadvantages have been eliminated. Scaling to higher voltages can be performed with high efficiency. Using my invention, converters can be designed that operate at power and voltage levels in the range of commercial power grids.

Returning to FIG. 2, the six capacitors 20, 21, 22, 23, 24, 25 are charged in parallel with the polarity as shown by triggering, at the time $T_o$, $SCR_0$, 26 $SCR_1$, 27 $SCR_2$, 28 and $SCR_3$ 29 through the diodes $D_1$ 30 and $D_2$ 31. (The demonstration device used two SCRs in place of the diodes.) With the use of resonance charging inductor $L_0$ the capacitors are charged to twice the input voltage Vin 33.

In this voltage step-up mode the capacitor string is charged in an alternating sequence such that each adjacent capacitor has the opposite voltage polarity. The voltage of the capacitor string, when fully charged, is then zero. Two series connected capacitors can be considered a stage and forms a basic building block with a voltage transformation ratio of a factor of two. To increase the voltage transformation ratio additional stages can be added.

The charging period is defined by the $L_0$ 32 input charging inductor and the parallel capacitor value (six times $C_1$). The half sine wave charging period is given in terms of the component value shown by the following equation:

$$T_c = \pi \sqrt{(6 \, L_0 \cdot C_1)}$$

and is the time between $T_0$ and $T_1$. The peak current is given by:

$$I_{max} = V_{in} \sqrt{(6 \, C_1/L_0)}$$

With the SCRs 0, 1, 2 and 3 recovered the triggering of $SCR_4$, 35 $SCR_5$, 36 and $SCR_6$ 37 will start the inversion cycle shortly after the time $T_1$.

The purpose of the step-up inversion cycle is to change the polarity of half of the capacitor strings such that all of the capacitors have the same polarity. In the above schematic the polarity of capacitors $C_2$, $C_4$, and $C_6$ are being reversed in the selection of a positive output voltage. The reversal time period for capacitors $C_2$, $C_4$, and $C_6$ occurs between time markers $T_1$ and $T_2$, and is given by:

$$T_i = \pi \sqrt{(L_1 \cdot C_2)}$$

The utilization of a unidirectional switch such as SCRs, GTOs or Crossatrons are important for the inversion process. Such switches or switching configuration prevents the current from ring back through the inductor and allows the extraction of the inverted energy in an efficiently and controlled fashion.

The temporal voltage history for both the even and odd capacitors are shown in the lower left hand corner of the figure. The current shape is again a half of a sine wave where the peak current is given by;

$$I_{max-2} \approx V_{in}\sqrt{(C_2/L_1)}$$

The operating condition for the capacitors $C_4$ and $C_6$ are identical to that of $C_2$. During the inversion cycle the voltage across the capacitor bank has the form given by:

$$V_{bank} = 4 \cdot N \cdot V_{in}(1-\cos(\pi \cdot t/T_i))$$

where N is the number of stages (three for given example). It can be seen that for the circuit given a step-up, neglecting losses, of a factor of 12 is obtained. The positive voltage across $C_1$ to $C_6$ capacitor stack can then be switched to the output.

From an operational point of view the maximum stack voltage can be several times the filtered output voltage. One may wait until the inversion process is completed. However the given circuit allows us to start the discharge cycle, in the interest of shorting the complete TPCS cycle, as soon as the inversion cycle is 50% completed. An earlier start of the discharge will leave residual voltage in the capacitors and will make the charge cycle and control function more complex.

The inverted energy switch-out completes the TPCS cycle. This utilizes for most applications a switch $SCR_7$ 40 and an output inductor Lout. In addition an important Free Wheeling Diode (FWD) $D_3$ 42 is shown in the circuit. This configuration allows a complete and efficient energy output transfer by selecting a high output voltage and the appropriate output inductor and filter component.

With the output impedance of the filter lower than the TPCS output section a significant amount of the energy will be transferred into the output inductor. Part of the energy would ring back in to the TPCS capacitors and will recharge them with opposite polarity. However, the function of the Free Wheeling Diode will prevent the recharging and will turn on as the capacitor voltage becomes zero. At this point the next TPCS recharge cycle can start, while the remaining energy from the output inductor is injected into the output filter as shown by the asymmetric current trace. The FWD not only allows a complete energy output transfer but also performs part of the output filtering as can be seen from the output inductor current trace in the lower left hand corner.

Two traces of capacitor voltage waveforms are shown. The odd numbered capacitors are simply charged to positive polarity during the $T_0$ and $T_1$ period, remain at this level between $T_1$ and $T_2$ and are discharged during the third part of the $T_2$ and $T_3$ TPCS cycle. As shown in the lower left hand corner, the even capacitors such as $C_2$ are charged negatively during the $T_0$ and $T_1$ period, changed from negative to positive polarity during the $T_0$ and $T_1$ period, and are discharged together with the odd capacitors during the $T_2$ and $T_3$ period. The voltage across the capacitor string remains zero during the initial capacitor charging cycle and becomes maximum during the inversion cycle as shown in the upper left corner.

DC to DC Step-Down Transformation

Figure 3:
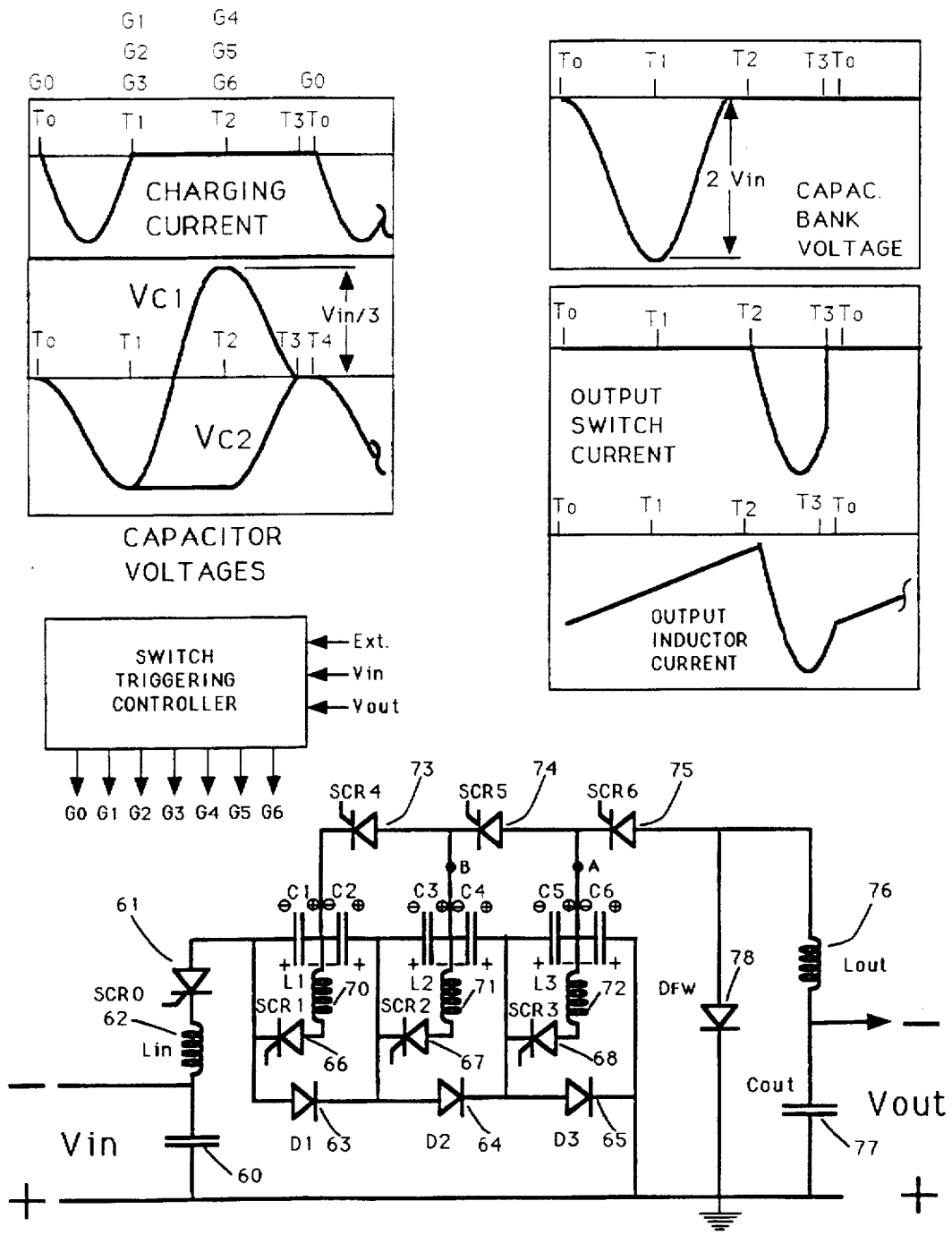
FIG. 3 is a three stage TPCS DC to DC voltage step-down transformation circuit.

The TPCS has the capability of step-up as well as voltage step-down. FIG. 3 shows the electrical schematics and some selected voltage and current waveform for a three stage DC to DC transformation. In addition I have selected a negative to negative polarity transformation. Reversing all of the shown solid state devices would simply change the device to a positive to positive step-down voltage inverter.

The step-down transformation cycle utilizes the same three subcycles of charging, inversion, and discharging of the TPCS capacitors. The major differences is that the internal TPCS process is executed in the reversed order, as will become apparent from the following discussions. Instead of charging the capacitor in parallel and discharging them in series, as is the case for the step-up, in the step-down the capacitors are charged in series and discharged in parallel.

The charging is started with the triggering of the input switch $SCR_0$ 61. With the utilization of the input inductor Lin 62 the capacitor string, $C_1$, $C_2$, $C_3$, $C_4$, $C_5$, and $C_6$ will be charged to an electrical potential of about twice that of the input voltage Vin. Since the charging occurred in series the capacitor polarity is plus-minus-plus-minus, as is indicated above the capacitors on the diagram. We recognize that this is the same electric state as for the step-up configuration shortly before the TPCS discharge.

The second subcycle is initiated by triggering the switches $SCR_1$, 66 $SCR_2$, 67 and $SCR_3$, 68 at the time $T_1$. With the proper selection of the inductors $L_{1, 70}$ $L_2$, 71 and $L_3$ 72 the inversion is completed at $T_2$. During this cycle the voltage polarity of the odd capacitors are being changed in the same fashion and with a time period control as has been described for the step-up transformation above. The utilization of unidirectional switches such as SCRs current is prevented from flowing back. The voltage polarity of the capacitor after the inversion cycle is shown below the capacitors. At this point the capacitor bank, measured from end to end, is zero as is illustrated with the waveform in the upper right hand corner. We recognize this to be the original state of the voltage step-up configuration.

With the inversion completed the energy switch-out cycle is initiated by triggering the switches $SCR_4$, 73 $SCR_5$, and 74 $SCR_6$, 75 at the time $T_2$. The diodes $D_1$, 63 $D_2$, 64 and $D_3$ 65 complete the discharge circuit. The discharge period is again selected with the value of the output inductor Lout 76 defining the discharge period to the time interval of $T_2$ to $T_3$. The Free Wheeling diode $D_{FW}$ 78 prevent the recharging of the capacitor bank, allows the complete discharge of the TPCS capacitors, and aids in the output filtering process.

As soon as the Free Wheeling diode comes in to play the output SCRs will start to recover and the recharge cycle can be started again. As can be seen this type of step-down inverter is through-put limited and allows both current and power limitation. As soon as a load fault is detected the output can be simply turned off by stopping all triggering outputs from the gate controller. At this point the TPCS DC to DC step-down inverter will simply function as a DC shut-off switch.

The voltage waveforms are shown in the upper left hand corner and with it are also given the trigger timing for all of the SCRs gates. The output switch and output inductor currents are also shown and assume that all of the output SCRs are triggered simultaneously. If the output load is low one may reduce the output filtering requirement by staggering the output by discharging two capacitors at a time. By inserting two additional diodes in the circuit at positions labeled "A" and "B" the capacitors $C_5$ and $C_6$ can be discharged first by only triggering $SCR_6$. The discharge of capacitors $C_3$ and $C_4$ are next by triggering $SCR_5$. The final discharge of capacitors $C_1$ and $C_2$ is initiated with the triggering of $SCR_4$. The diodes at position "A" and "B" prevent the recharging of the discharged capacitors.

Four Quadrant Step-Up and Step-Down Operation

In the above description I have shown DC to DC converter for positive to positive step-up and negative to negative step-down. Inspection of both circuits shows that by changing a few components an output with an opposite of that of the input can be obtained. In fact a single TPCS device can combine all possible or a selected combined input and output polarity options.

Figure 4:
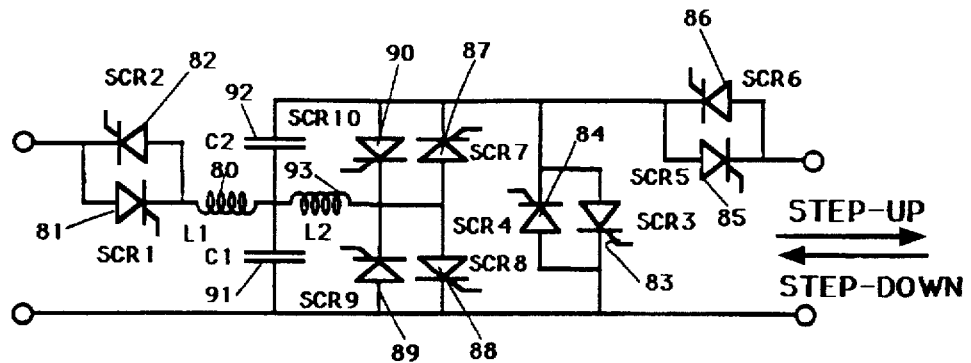
FIG. 4 is a four quadrant step-up and step-down TPCS configuration allowing power flow control in both the forward and backward direction.

The schematics of FIG. 4 shows a single stage TPCS that can step-up either a positive or negative polarity to either the same or opposite polarity. As shown power flowing from left to right will function as a step-up inverter. With the input coming from the right a step-down transformation takes place. The transformation in both directions have, with all components shown, full four quadrant operational options. One may implement all or only part of the options. The table in FIG. 4 lists the necessary components required for a specific option with "X" designating the step-up and "Y" the step-down components. The components required for a specific or multiple choice operation must include all of the components under the designated columns. Of interest is that the configuration with polarity inversion allows power flow in both directions without the increase of a single additional component.

For example, the configuration for an AC to DC converter to either step down or step-up can be derived by the combination of two parallel TPCS inverters. One inverter would be used for the positive to positive conversion during the positive half of the input AC cycle and a second inverter for the negative half of cycle with a negative to positive transformation. Since the high voltage switching section are the more costly components, it is prudent to maximize its utilization and combine in one device both functions. For the above example of an AC to DC step-up transformer/rectifier configuration both functions may be combined into one unit. This requires the sum of the components indicated by "X" under column one (+in to +out) and three (−in to +out). For this example the high voltage $SCR_5$ and the associated Free Wheeling diode (not shown) are shared for both halves of the cycle.

In summary the TPCS has a high degree of input and output polarity flexibility and all or a selected option may be combined into one TPCS module.

AC to AC Transformation

Figure 5:
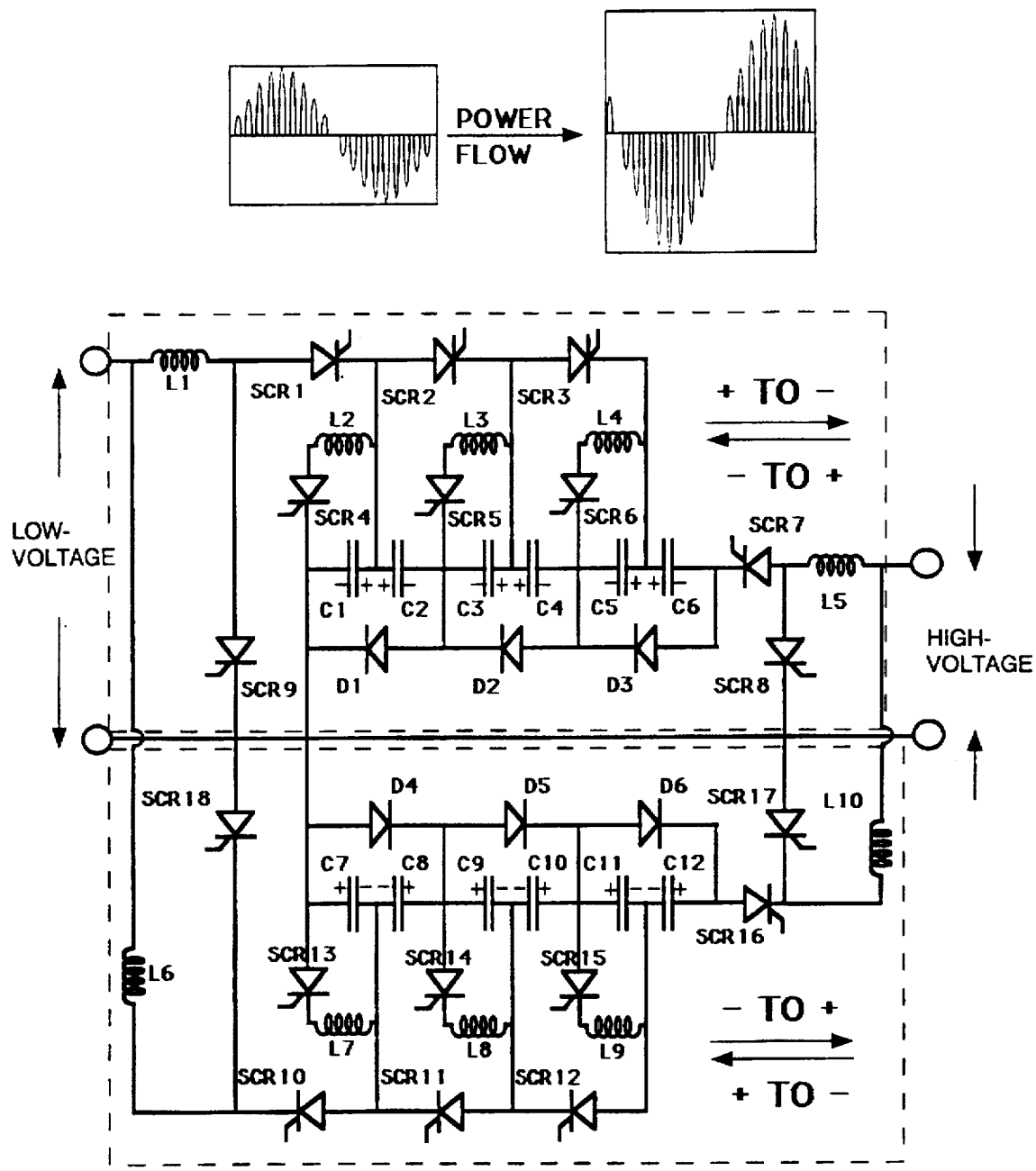
FIG. 5 is a single phase three stage TPCS AC to AC transformation circuit with bi-directional control capability and with phase inversion.

This section gives an illustration of a single phase AC to AC transformation device. It is configured to use two parallel modules with each module operating in an inverting mode. The device, as shown in FIG. 5, allows controlled power flow in both directions. From left to right the AC is inverted and transformed up. The power flow can also be reversed with the flow from right to left. This will result in a controlled voltage step-down.

Starting my description with the positive input cycle and with the power flow from the left. The turn-on of $SCR_1$, $SCR_2$, and $SCR_3$ will initiate the charging of the upper capacitor string $C_1$ to $C_6$ through the diodes $D_1$, $D_2$ and $D_3$. The lower module is not active during the positive input cycle and its components are allowed to cool-off. The positive charging period is controlled by the selection of the $L_1$ charging inductor value and will yield a capacitor voltage nearly twice that of the instantaneous input voltage, provided that the TPCS cycle is selected to be significantly shorter than an AC cycle. Under this condition the device operation is nearly identical to that of the above DC transformation configuration with the exception of a "slowly" varying input voltage.

The capacitor polarity is shown next to the capacitors after the charging cycle is complete. Triggering $SCR_4$, $SCR_5$, and $SCR_6$ will start the inversion cycle changing the voltage polarity of capacitors $C_1$, $C_3$, and $C_5$. This will produce a negative voltage of six times that of a single capacitor across the upper capacitor string. Triggering $SCR_7$ will start the negative voltage output discharge cycle through the inductor $L_5$. As soon as the voltage of the capacitor string changes from negative to positive polarity the $SCR_8$ is being triggered that will prevent part of the energy in the inductor $L_5$ to recharge the capacitor string to the opposite polarity. The $SCR_8$ acts as the previously described Free Wheeling diode, however a switched device is required for AC output operation. With the $L_5$ inductor current transferred to $SCR_8$, the $SCR_7$ will recover and the next charging cycle, with a slightly changed input voltage, can begin. The $L_5$ inductor in conjunction with the output filter will deliver a partly filtered AC output.

The upper TPCS module operation, with the positive input cycle and producing a negative output cycle, is continued many times per cycle until the AC input voltage swings negative. At this point the upper module becomes inactive and the lower TPCS module is activated.

The operation of the lower module with the negative input and the positive output cycle is identical with the exception of the inverted polarity. The TPCS charging is initiated with the triggering of $SCR_{10}$, $SCR_{11}$, and $SCR_{12}$ charging the capacitors $C_7$ through $C_{12}$, with the polarity as shown on the schematics. For the inversion $SCR_{13}$, $SCR_{14}$, and $SCR_{15}$ are used with the output switching function performed by $SCR_{16}$. The $SCR_{17}$ is the positive output cycle Free Wheeling switch. Two output inductors are shown, one for each polarity. One inductor could be eliminated.

The power throughput and output voltage regulation is performed with the controlled turn-on of the above switches (SCRs) using a controller and triggering module, not shown to simplify the schematics. The controller would again sense the input and output condition for the control function and perform the regulation with the option as has been described for the above DC transformation. In addition internal TPCS diagnostic points are also monitored for fault protection.

FIG. 5 shows for a complete AC cycle the TPCS capacitor input voltage and the inverted output voltage. For constant TPCS frequency the output follows directly the input waveform shape. Correction to input voltage distortion can be made by altering within an AC cycle the TPCS frequency.

The above single phase TPCS AC to AC transformation allows regulated AC voltage transformation. With the appropriated control it can, in addition, perform other functions such as turning the power on and off, perform as a circuit breaker, perform as controller for a device start, and harmonic filter or anti-harmonics generator.

The configuration of FIG. 5 allows also regulated power flow from right to left. This direction of power flow will yield a voltage step-down with a step-down ratio defined by the number of stages installed. Additional regulation is obtained with the inverter frequency selection. With the exception of the Free Wheeling switches, all of the other components are used. The Free Wheeling switch is the only element that is only operational at the "transformer" output end. In the step-down mode, the upper TPCS module transforms the negative input voltage from the right to a positive and reduced output voltage to the left, while the lower module generates the negative output cycle on the left with a positive input from the right. In this mode of operation the capacitor strings are charged in series with a high voltage, with capacitor terminals connected with alternating polarity. The inversion cycle changes the polarity of half of the capacitor to the configuration as shown on the schematics. This allows the energy to be extracted to the left. The additional $SCR_9$ and $SCR_{19}$, not utilized in the step-up transformation, perform the Free Wheeling switch function for the positive and negative cycle respectively. The filtering sections on both the input ends, not shown, assure a smooth input and output power line.

The above single phase AC to AC TPCS transformation module can be used as a building block for a bi-directional polyphase regulated voltage transformation system with an effective 180 degree shift in phase angle.

AC to DC Transformation/Inversion

State-of-the-art generation of high voltage DC from an AC input requires an AC transformation followed by a rectification step. Power distribution systems typically use an AC transformer at grid frequency to perform the voltage step-up and a rectification step at high voltage. This is an efficient process, however harmonic filters are required to eliminate harmonics generated by the rectification process. In addition power factor corrections are required. DC power levels in excess of one megavolt are generated this way for long distance power transmission.

For lower weight and compacted application the Schwarz converter may be used by first rectifying the AC, converting the DC to high frequency AC, performing the AC transformation with a significantly reduced transformer, and finally rectifying the high frequency stepped-up AC power to produce DC. The transformation process at high frequency significantly reduces the transformer weight, however, at the expense of reduced efficiency. In addition this process further penalizes the efficiency further as the output voltage is increased much over a 50 KV output.

In contrast my TPCS approach uses the AC input directly and requires no transformer at all. In addition no harmonics are generated with the TPCS conversion process and the AC input power factor is for all practical purposes unity. By eliminating the transformer and harmonic filters the TPCS AC to DC conversion not only can compete with the commercial efficiency at the same voltage and power level, but also is more economic and much smaller in size.

Figure 6:
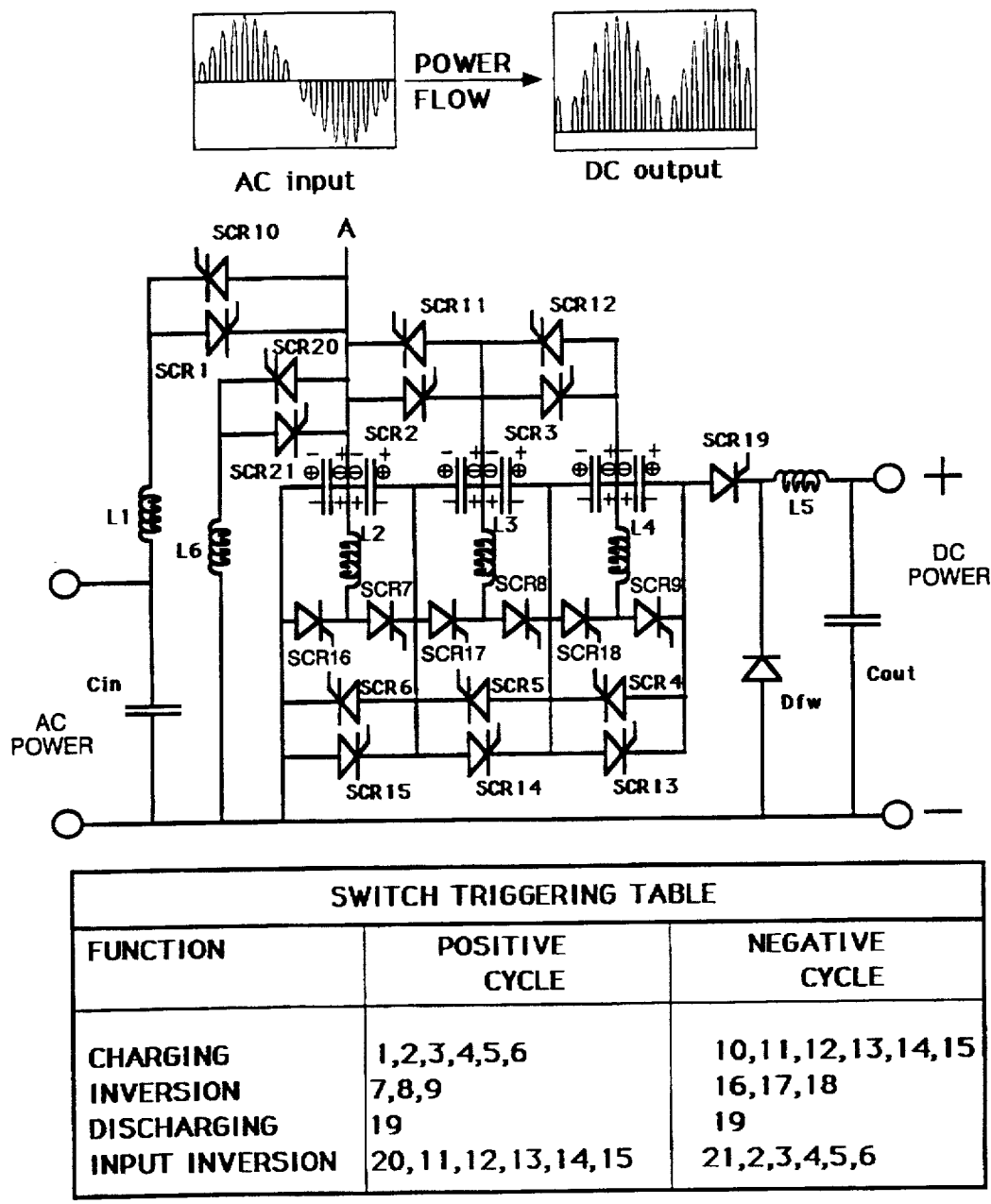
FIG. 6 is a typical single phase three stage AC to DC converter module with voltage step-down transformation.

The DC output can be obtained using either two TPCS modules as described above. One module would transform the positive and the second one the negative AC input cycle to high voltage DC. A second option is shown in FIG. 6 that combines both functions in one module. It performs the positive to positive and negative to positive functions and has the sum of the components listed in the first and third columns of the table in FIG. 4. Combining the low voltage input functions and sharing the high voltage output functions makes in many applications technical and economical sense since it shares the two high voltage output switching section components of $SCR_{19}$ and Free Wheeling Diode $D_{fw}$.

For the positive AC cycle $SCR_1$, $SCR_2$, $SCR_3$, $SCR_4$, $SCR_5$, and $SCR_6$ are turned on to initiate the TPCS charging cycle. This charges the capacitors with the polarity as shown below the capacitors. For the positive input cycle triggering $SCR_7$, $SCR_8$, and $SCR_9$ starts the inversion. This will result in a capacitor polarity as is shown on top of each capacitor. The inversion will yield an output voltage of 2nVin, where the "2" comes from the resonant charging process and "n" are the number of capacitors in the capacitor string. Triggering the $SCR_{19}$ will initiate the output cycle through the output inductor $L_5$. The capacitors $C_{in}$ and $C_{out}$ are part of the input and output filtering section respectively. The Free Wheeling Diode $D_{fw}$, prevents the capacitor bank voltage from swinging negative and allows efficient output energy transfer. The positive TPCS operation is repeated as long as the input cycle is positive.

As the AC input voltage swings negative the controller and triggering module (not shown) switches over to the $SCR_{10}$, $SCR_{11}$, $SCR_{12}$, $SCR_{13}$, $SCR_{14}$, and $SCR_{15}$ for the charging cycle leaving the capacitors with the polarity as shown in the circles. To produce a positive output voltage the $SCR_{16}$, $SCR_{17}$, and $SCR_{18}$ are used to invert the other set of capacitors. The discharge cycle is identical to that of the positive input cycle operation and again uses $SCR_{19}$ and Free Wheeling diode $D_{fw}$.

The input and output current is as shown (not to scale) in FIG. 6 and consists for an AC input cycle of many TPCS cycles. Using a high frequency output filter will produce a stepped up voltage with a shape that is nearly identical to that of a full wave rectifier. To reduce the input line ripple for a TPCS single phase AC to DC transformer/rectifier standard filtering has to be added to the output. As with a regular filtered full wave rectifying configuration phase distortion takes place with harmonics generation, since during the low voltage part of the input the rectified voltage is lower than the filtered output voltage and no energy can be transferred. This applies also for the TPCS rectification process but to a lesser degree, since the TPCS transformation ratio can be selected to be arbitrarily high without major impact on the system efficiency. Such harmonics can be completely eliminated with the single as well as with a multiple phase TPCS AC to DC inverter.

One approach to eliminate input harmonics is to add to the FIG. 6 circuit inductor $L_6$, $SCR_{21}$ and $SCR_{21}$. The function of these components is to invert the capacitor bank if the bank voltage is too low. By inverting the complete capacitor bank the capacitors will start out with a nonzero voltage of opposite polarity than the input voltage. This condition will allow the capacitor bank to be charged repeatedly until the voltage is sufficiently high to allow a full discharge into the DC output grid. The charging process is performed in such a rate to extract the correct energy and charge from the AC input cycle to prevent harmonics generation. The process for the positive input cycle is as follows. If after the charging the capacitor voltage is too low, the following switches are being triggered; $SCR_{20}$, $SCR_{11}$, $SCR_{12}$, $SCR_{13}$, $SCR_{14}$, and $SCR_{15}$. The current will be flowing through the inductor $L_6$, until the capacitor changed their respective polarity. The inductor value can be selected to optimize this operation. After the bank inversion is complete a new positive input charging cycle is initiated as described above. Since an initial voltage of negative polarity is on the capacitors, the bank will be charged to a higher voltage. This process can be repeated several times until the voltage is sufficiently high. For the negative cycle the same procedure can be used by selecting the correct switches. The Table in the figure lists all of the switches used for the various operations. The described bank inversion process falls under "INPUT INVERSION" column.

To calculate quantitatively the multiple charging process let us assume that the input voltage is $V_i$ and the initial capacitor voltage is given by $V_{ci}$. The final capacitor voltage will be;

$$V_{cf} = 2 V_i - V_{ci}$$

this equation applies as long as the initial capacitor voltage is less than the input voltage. This yields a charging voltage of $V_{c1} = 2 V_i$ for the first charge cycle, since the initial capacitor voltage is zero. After the first charge cycle the energy in the capacitors is;

$$E_1 = 1⁄2 \, C \, V_i^2$$

where C is the capacitance of an individual capacitor. By inverting all of the capacitors the initial $V_{ci}$ for the second charge cycle is $-2\ V_i$ and will yield a charge voltage of $V_{c2}=4\ V_i$ and energy of $E_2=4\ E_1$. This can be repeated to yield after "n" cycles a capacitor voltage of $V_{cn}=2\ n\ V_i$ and energy of $E_n=n^2 E_1$. The use of this cycle inversion in conjunction with the appropriated intervals between charging cycle allows the loading of the AC input such that no harmonics are generated and the effective load for the AC grid appears to be resistive.

A modified charge approach can be used with a polyphase AC grid that does not require the full bank inversion between charge cycle. By charging sequentially from different phases with opposite polarity the bank inversion and some switches can be eliminated with an increase of the logic complexity. This will be further covered in a later section.

Polyphase AC to DC Transformation/Inversion

The single phase AC to DC conversion configuration described in the previous section can be used as a building block. However most high power converters use a polyphase input such as the output of a generating plant. The single phase TPCS step-up transformer/rectifier module input section described, can be modified to allow inputs from more than one phase. This modification in conduction with the appropriate switch control and trigger logic can obtain harmonic free input and output power without the use of harmonic filters.

A balanced polyphase generating system delivers constant power if operated into a linear resistive load. To simulate such a resistive load the TPCS must extract from a single phase a power level that is proportional to the square of the instantaneous line voltage. For the simple charge mode described for the AC to DC transformation process the inverted TPCS can not inject the energy into the load during the low voltage part of the AC cycle. A repeated charge and inversion process with one phase may be used to solve this problem. This section will describe a second method that utilizes the voltage input from a plurality of phase. This architecture and mode of operation can be also adopted for reactive power generators, harmonic filters and can correct the power in an unbalanced line.

Figure 7:
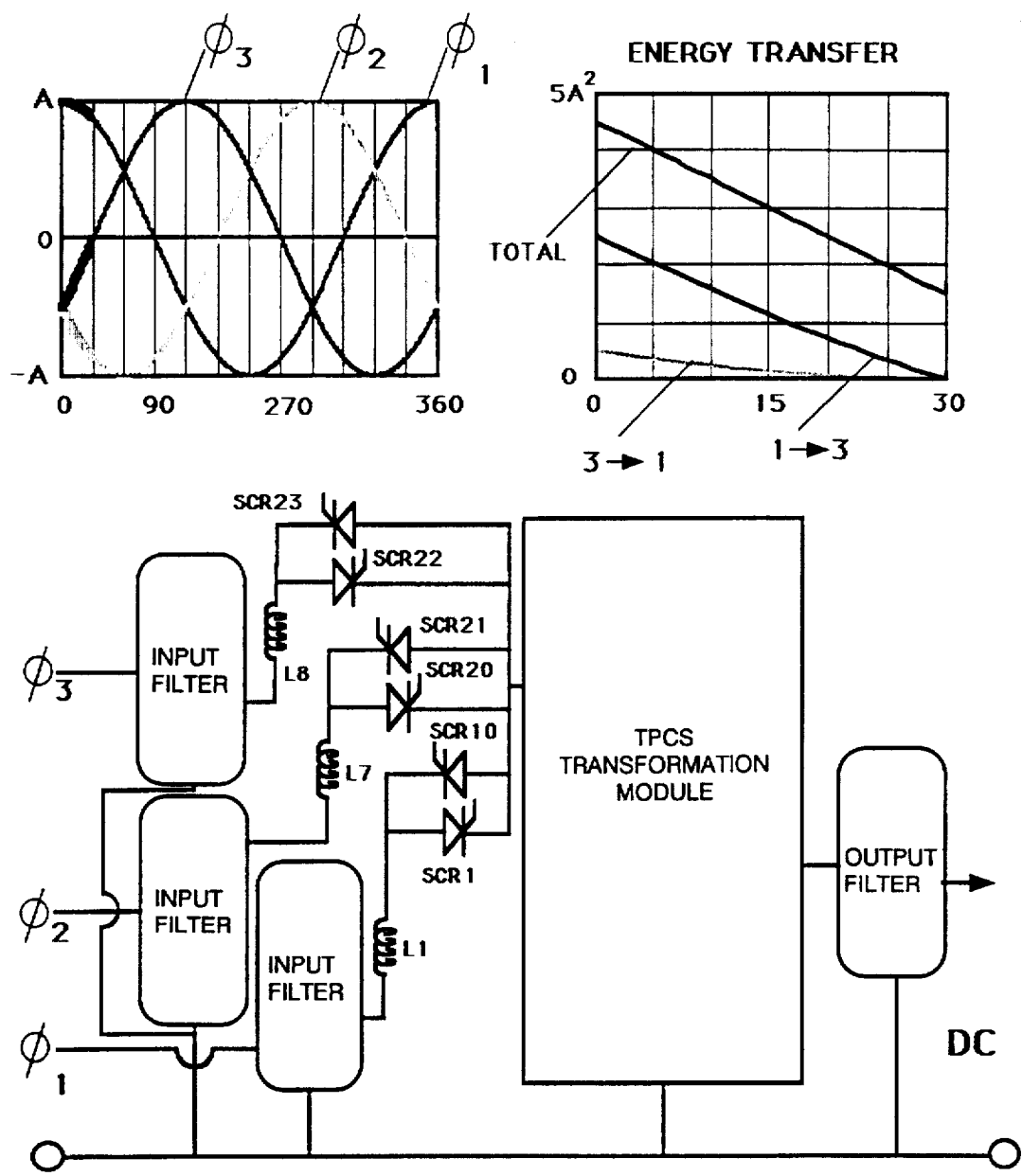
FIG. 7 is a typical polyphase TPCS AC to DC conversion system with three phase input.

FIG. 7 shows the schematic diagram of a three phase AC to DC converter. The converter module contains the components as shown in FIG. 6 with two additional input sections connected to the electrical point "A" as labeled in FIG. 6. With the additional two input sections the device can accept the input from all three grid phases and for both the positive and negative AC cycle. The output will be a constant and stepped-up voltage DC with constant power. The other important feature is that controlled energy can be extracted from all three phases at any voltage specifically at the low voltage part of the cycle thereby eliminating the formation of harmonics on the AC input lines and ripple on DC line.

The charging cycle of phase 1 is controlled by $SCR_1$, and $SCR_{10}$ and is assumed to have the voltage waveform of $V_1(t)=A\ \cos(w\ t)$. Phases 2 and 3 are controlled by $SCR_{20}$, $SCR_{21}$, and $SCR_{22}$, $SCR_{23}$ respectively. The waveforms are plotted in FIG. 7. Specifying a regulated and filtered output of DC of $V_{DC}=3*A$ the inverted output voltage must be a minimum of $6*A$ and therefore, requires that the capacitors are charged to a voltage of a minimum of A. Using the resonant charging mode it follows that the minimum line voltage must have an absolute value of A/2. The harmonics are generated on phase 3 by not extracting energy for an electrical phase angle between 0–60 and 180–240 degrees. This problem can be simply rectified with a consecutive bipolar charging sequence as will be described for the first 30 degrees with the aid of the voltage waveforms in FIG. 7. During the first 30 degree electrical phase angle period phase 2 can charge the capacitors to the required voltage A and a single charge operation is used. The problem is that phase 3 has an absolute line voltage of less than A/2. By triggering $SCR_{23}$ the capacitors will be charged negative to a value $2\ V_3$, and will extract an energy of $E_3=2\ V_3^2$ (assuming unit capacitance for simplicity). With the capacitor bank being negative we next trigger the $SCR_1$ for a positive charge cycle of phase 1. This will charge the capacitor bank to $V_{31}=2\ (V_1-V_3)$. Since $V_3$ is negative, the charge voltage is larger then "A". At this point the TPCS performs an inversion followed by an extraction cycle.

The total energy extracted transferred is $E_T=2\ (V_1-V_3)^2$. The energy extracted from phase 1 is $E_{31,1}=2\ V_1(V_1-2\ V_3)$. The two step charging process increases the energy extraction.

The two step charging process can be reversed by first charging with phase 1 followed by phase 3. It can be shown that the total energy transfer is the same, however the energy extracted out of phase 1 is $E_{13,1}=2\ V_1^2$ and from phase 3 $E_{13,3}=2\ V_3(V_3-2\ V_1)$ .

The graph in the upper right hand corner of FIG. 7 shows the energy transfer over the first 30 degree range. The upper graph shows the total energy transfer from both phases. The two remaining curves show the energy extracted from phase 3 using for the lower curve the charging sequence of phase 3 followed by phase 1, while the center trace is for charging sequence of phase 1 first followed by phase 3. The energy extracted from phase 1 is the difference between the total energy and the energy given with the curves shown for phase 3. The energy extraction result from a given phase is drastically different depending on the order of charging and can be fully utilized in the optimum control of the TPCS transformation process.

At the 30 degree point phase 3 becomes positive and the two step charging scheme is being used between phase 3 and the negative phase 2. This process continues until phase 3 reaches a value of A/2 at the electrical 60 degree point. At this point the rolls between phase 3 and 1 are exchanged and the process continues.

The controller monitors the input and output voltage and controls the switch triggering sequence and the time periods between charging. Several TPCS modules may be used to increase the power throughput and reduce the high frequency filtering requirements. Some of the inductors, input and output filters may be shared.

In summary the TPCS polyphase AC to DC converter can be configured to allow constant power throughput thus eliminating all harmonic filtering requirements on the AC as well as major ripple filtering on the DC side. In addition a unity power factor is maintained, since the current and voltage is maintained to be in phase.

DC to AC Conversion

The reconversion from high voltage DC to a polyphase AC can be performed at the end of a long distance DC transmission line or at the end of a DC power distribution system. The DC power can be converted to a balanced three (or multiple) phase AC output with constant loading of the DC input. The output can be precisely matched to the phase, frequency, and voltage of the existing grid or to a specific output requirement. In the TPCS conversion process the DC line will be loaded again uniformly and the converter will provide a harmonic free voltage or power regulated AC output. The DC power is stepped down to the required AC voltage level without the requirement of costly transformers, harmonic filters on the AC end and input filters on the DC side.

The TPCS inverter is a power converter in which the normal direction of power flow is from a high voltage DC source to an AC load. Its typical operation control modes can be classified as a Variable output Frequency Modulated (VFM) inverter. The TPCS and its control system can reconstruct an unlimited family of output waveforms. One of the waveforms can be the desired AC output with the desired voltage, frequency and phase.

For an AC waveform reconstruction the TPCS system can be fully charged from the DC line but with continuously varying charging intervals during the AC output cycle. The interval spacing will be inversely proportional to the square of the instantaneous output voltage requirement. As the AC power requirement changes the charging intervals change inversely with the power demand. The TPCS inverter could also be operated as a constant frequency but with Variable Amplitude (VAC). This requires a variable output amplitude control with the energy output per pulse being proportional to the square of the instantaneous output voltage requirements. Each approach has its advantages and disadvantages. The mode of operation, described below, uses a combined mode and is of Variable Frequency with Variable Amplitude Control (VFM/VAC).

Figure 8:
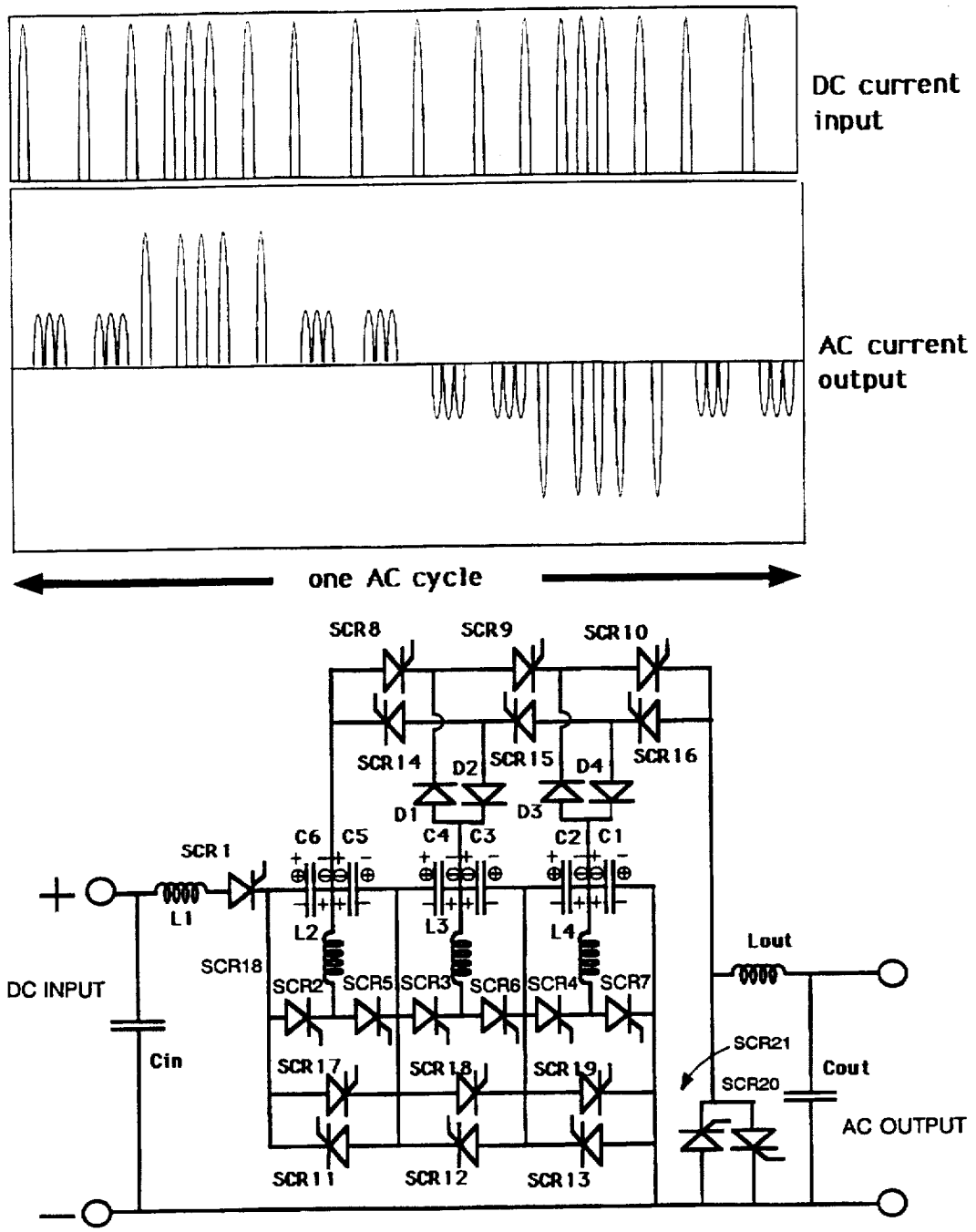
FIG. 8 is a typical circuit of a three stage DC to single phase AC inversion module with voltage step-down transformation.

FIG. 8 shows a module to reconstruct one phase of a polyphase AC line from a DC input. The control circuit has been neglected for clarity. A high DC filter allows the series charging of the capacitor bank consisting of a three stage TPCS module. The capacitor bank is resonantly charging through the inductor L1 by triggering $SCR_1$. For the reconstruction of a positive output cycle the inversion switches $SCR_2$, $SCR_3$ and $SCR_4$ are used. The capacitors voltage polarity before and after the positive cycle inversion are shown by the upper and lower set of signs respectively. The middle set of signs next to the capacitors shows the inverted capacitors voltage polarity for the negative AC cycle. The positive output cycle discharge is initiated by triggering $SCR_8$, $SCR_9$, $SCR_{10}$ and $SCR_{11}$, $SCR_{12}$, $DCR_{13}$. As before the $SCR_{20}$ is used as a Free Wheeling Switch to prevent the recharging of the capacitor bank. This allows the maximum power throughput at the top of the cycle by discharging all of the capacitors simultaneously. During the lower part of the AC cycle the capacitors can be discharged at a slower rate by using a sequential discharge. The electrical circuit shown allows such a mode by first triggering $SCR_{10}$ and $SCR_{13}$ to discharge $C_1$ and $C_2$. Triggering $SCR_9$ and $SCR_{12}$ next, while $SCR_{10}$ and $SCR_{13}$ are still conducting, will allow the discharge of capacitors $C_3$ and $C_4$. The diode D3 is added to prevent the capacitors $C_1$ and $C_2$ to be recharged. Finally the set of $C_5$ and $C_6C_1$ are discharged, with $D_1$ being used as a blocking diode to prevent the recharging of $C_3$ and $C_4$. This mode of charging and discharging allows a smoother output for the lower voltage part of the AC cycle and with it a reduced high frequency filtering requirement. The disadvantage is the additional cost of the diodes and its associated voltage drop and power losses.

The negative cycle is reconstructed in a similar manner. The TPCS charging cycle is identical. The difference starts with the negative inversion cycle by triggering $SCR_5$, $SCR_6$ and $SCR_7$. For the negative output cycle the switches $SCR_{14}$, $SCR_{15}$, $SCR_{16}$, $SCR_{17}$, $SCR_{18}$, and $DCR_{19}$ are used. The diodes $D_2$ and $D_4$ allow a slower output discharge. In the upper part of FIG. 8 the charging and discharging current sequence are shown schematically. Only a limited number of cycles are shown for clarity.

To reconstruct a full polyphase output several of such modules are required with each one being appropriately controlled. If balanced harmonics are generated by the load the TPCS master controller can control the output to neutralize these harmonics. The output becomes simply the superposition of several frequencies with each frequency being controlled in amplitude and phase.

Variable Frequency Converter

We have seen that the TPCS can extract constant power from a polyphase AC grid or a DC line. This power can be used to reconstruct an AC polyphase AC grid with regulated output as has been covered above. The reconstruction of the AC grid is not restricted to the input frequency. This allows the use of the TPCS AC to AC transformation system as a direct link between two independent grids, operating with a different frequency or a different phase.

Furthermore the AC to AC TPCS system can be controlled to produce a variable frequency output for the regulation of high power linear induction motors. Since each output phases of the TPCS can be controlled separately the functions of two phases can be switched on a subcycle time basis producing a change in the phase sequence for an instantaneous change in the rotation of induction motors.

The use of a TPCS AC to AC step up converter could be used between a generator and the power grid. This would significantly improve the power grid electromechanical stability since the rotation of the generators are not required to be in perfect synchronism with the grid. In fact most gear boxes of generators can be eliminated, since the TPCS AC to AC converter can as efficiently convert and transform the balanced grid generator output of any frequency to match the frequency of the power grid.

In summary the TPCS AC to AC converter can be controlled to produce a variable frequency with simultaneous amplitude control with an efficiency similar to that of a standard AC transformer. No upper frequency output restriction does exist such as for the cyclone converter. In addition no harmonic or phase distortions are introduced on to the input grid.

Regulated VAR Generator

TPCS modules can be configured as a fast response phase angle correction system for both leading and lagging VAR. As described in the AC to DC power transformation a TPCS module can extract power or charges from a low voltage line and injects it into another line having either polarity and also higher instantaneous voltage. With the fast TPCS operating characteristics such a VAR generator can respond on the time scale of a fraction of an AC cycle. If properly controlled the phase angle correction is performed without generating either harmonics or phase distortion. For balance polyphase grids my VAR generator configuration does not require the storage of energy for part of a cycle as is normally required for most operating systems. However, for single phase VAR correction existing capacitor banks may be used in conjunction with TPCS modules to control the desired flow of reactive energy. By either extracting from the line or injecting back into the line the correct charge over the complete cycle, harmonics generation can be completely eliminated. This is performed, as for all of the described TPCS operation, without forced commutation of the switching elements. The natural or self commutating configuration of the TPCS modules add significantly to the overall system reliability, reduced complexity, and equipment cost.

For a polyphase grid the TPCS VAR control can be performed with independent single phase VAR controllers. Reduction of the energy storage requirement can be accomplished if the energy storage capacitor banks are shared between the TPCS single phase VAR generators. Since for a balanced grid the sum of the inflow and outflow of reactive energy and reactive current into the energy storage bank is zero at all instances of the AC cycle it becomes obvious that such a shared bank can be significantly reduced. In fact the capacitor bank and its charging and discharging steps can be completely eliminated with the reactive current extracted from one line and with the direct reinjected into another line. The simplified schematic in FIG. 9 illustrates such as system.

The illustration shows a controlled TPCS VAR generator for a three phase grid with a neutral. This architecture is equally applicable for grids having larger numbers of phases. Furthermore, it is not necessary to have a neutral since TPCS VAR generator modules can be directly connected between phases.

Figure 9:
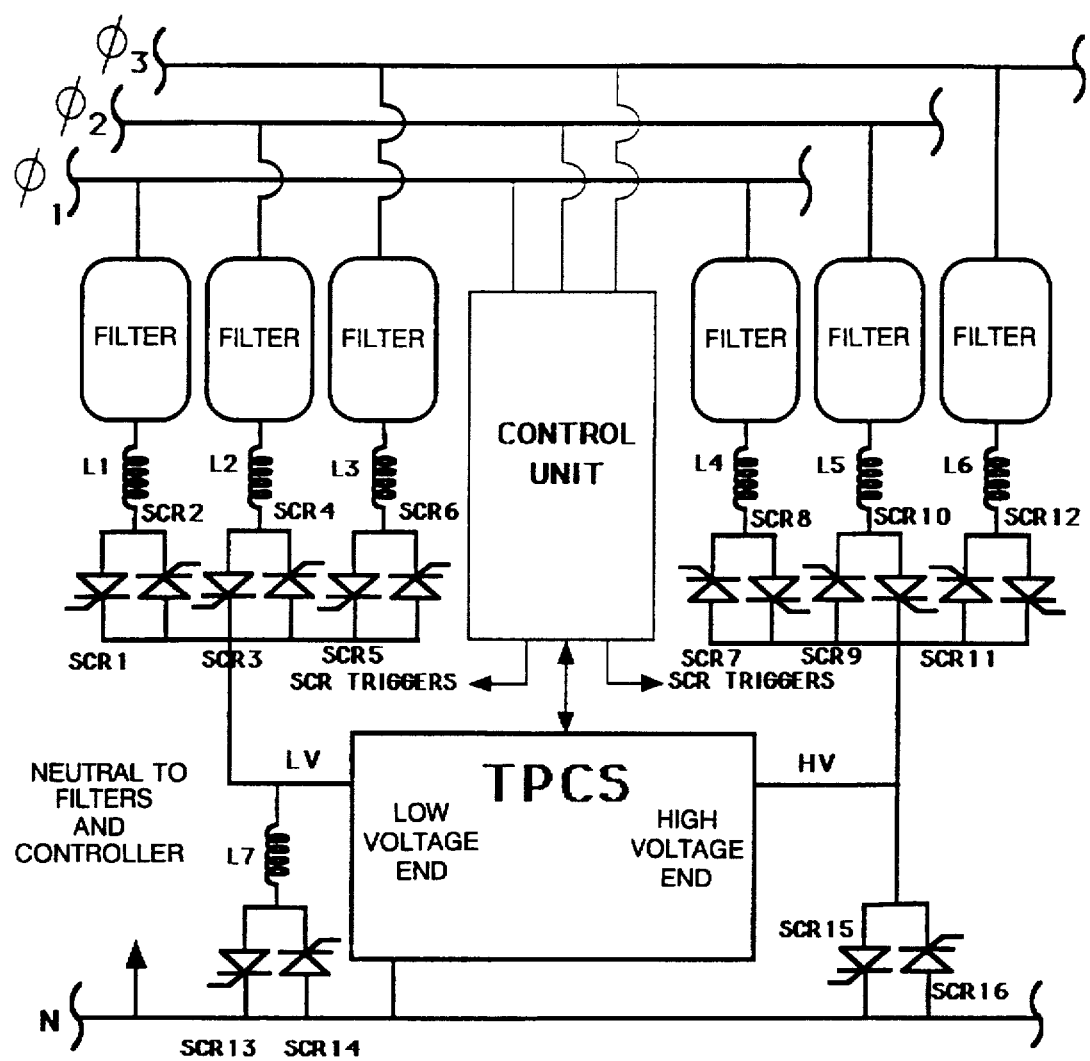
FIG. 9 is a typical polyphase TPCS VAR generator and harmonics filtering system for a three phase grid.

FIG. 9 shows a TPCS module with both the low voltage and high voltage sections connected to all three phases of the power grid. This system architecture is a generic module and can operate as a regulated VAR generator and harmonics filter. Both ends can be used for charge extraction or injection. For VAR generation mainly the low voltage end of the TPCS will be used. For harmonics filtering functions the front end is mainly used for energy extraction from the grid and the high voltage end for the energy reinjection.

The VAR generator controller can either regulate the reactive current or reactive power flow. Controlling either one will control automatically the other parameter. This will become apparent from the example and can be readily proven mathematically.

Assuming that a VAR generator is connected as shown in FIG. 9 to a three phase grid with a reactive load. The voltage and reactive currents are given by the following equations.

$$V1 = Vm \cos(w*t)$$

$$V2 = Vm \cos(w*t + 2\pi/3)$$

$$V3 = Vm \cos(w*t + 4\pi/3)$$

$$Ir1 = Iro \cos(w*t - \pi/2)$$

$$Ir2 = Iro \cos(w*t + \pi/6)$$

$$Ir3 = Iro \cos(w*t + 5\pi/6)$$

Figure 10:
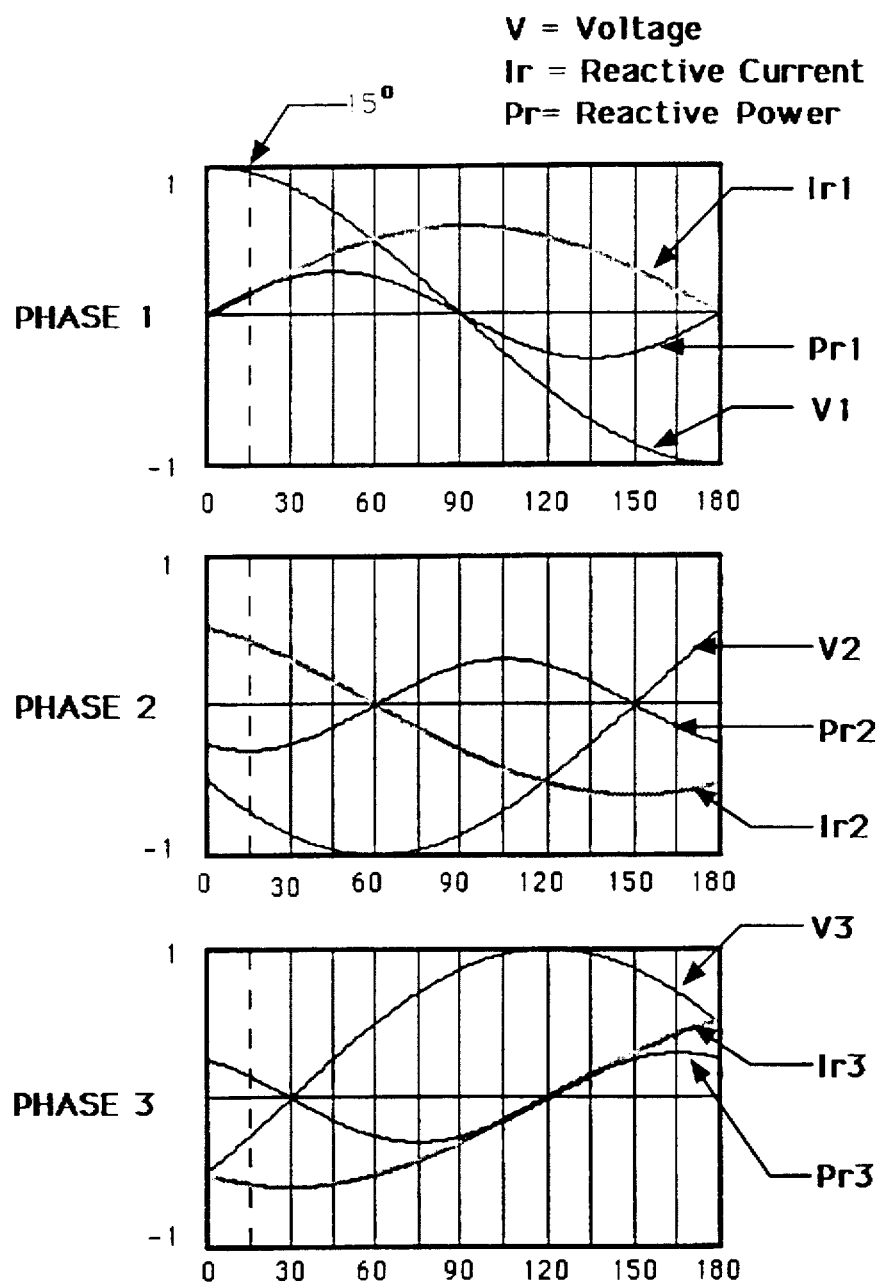
FIG. 10 is the voltage, reactive current, and power for a three phase grid.

FIG. 10 shows the power voltage, reactive current, and reactive power flow of all three phases. The operation will be demonstrated for a phase angle of $w*t = \pi/12$ or 15 degrees.

From the traces it can be seen that energy needs to be extracted from the grid when the shown reactive power is negative. We start out by triggering SCR4 to charge the capacitor from phase 2 through the inductor L2. The charging period is again controlled by the value of the inductor. FIG. 12 shows the result of the operation. Column 1 designates the operation and lists the phase involved, column 2 lists the control switches, column 3 is the initial TPCS capacitor bank voltage normalized to the maximum phase voltage amplitude Vm, column 4 gives the final capacitor voltage, column 5 lists the normalized charged transfer to the phase, and finally column 6 is the energy transferred to the phase normalized to the energy for the bank charged to a voltage Vm.

From the first operation we see that energy was extracted from phase 2 and that the bank was charged to twice the voltage of the phase. The positive number of the charge transfer column indicates that a positive current is being induced. The final voltage of the first operation becomes the initial capacitor voltage of the second operation. The second operation is initiated by triggering SCR5 in oder to inject a negative charge and energy into phase 3. The final capacitor voltage and charge transfer is given by;

$$Vf = 2 Vph - Vin$$

$$\Delta Q = C(Vin - Vf)$$

The energy injected into phase 3 is:

$$\Delta E = C(Vin^2 - Vf^2)/2$$

and is positive as expected. Operation 3 is an other recharged cycle from phase 3. We note an increase in energy transfer from that of the first operation as a result of the initial capacitor voltage.

Operation 4 is a second charge transfer to phase 3. This will leave the bank at a final positive voltage of significant amplitude to inject charge and energy into phase 1. This will leave the capacitor bank ready for another recharge from phase 2.

The above sequence of cycles extracts energy from phase 2 and transfers it to both phase 1 and 3. FIG. 13 shows the result of the 5 operations described. Column 2 shows the total charge transfers and can be quantitatively compared with the theoretical requirements by multiplying the reactive current by the appropriate time interval. The time interval was selected to match the charge injection requirement of phase 2. The operation is selected to balance correctly the charge injection between phase 1 and 3. Column 3 shows the reactive energy extraction or injection of the three phases and can be compared to the theoretical value in column 5. No attempt is made to track the energy transfer since by transferring the current directly the energy comes out automatically. FIG. 13 shows also the net charge and energy transfer for all three phases which should be zero. The computation balances for the exception of the residual energy in the bank. This energy will be used in the following operation.

The operation to this point involved simple charge and discharge operation. FIG. 12, operation 6, 7, and 8, shows an important sequence of operation when the TPCS capacitor bank voltage has the wrong voltage polarity for charge injection into phase 1. This requires either a complete voltage reversal internally of the TPCS or can be performed externally with the addition of the inversion section consisting of L7 and switches SCR13 and SCR14. After the number 6 recharge cycle the capacitor bank is left with a negative voltage. By triggering SCR14 the bank polarity was inverted before the charge injection operation involving phase 1 could be performed.

The control operation appears at first complicated, however the logic can be relatively easily formulated and can be readily implemented using modern control technology. A controller would detect the reactive current and compare it with the preprogrammed requirement. The frequency of operation would be selected to meet the magnitude of the VAR generating requirement. Computations would keep track of the reactive current flow distribution on the three phases and select from a series of operational sequences the best one to meet the required reactive current distribution and stay within TPCS operational limitations.

The described VAR regulation can be modified to operate between phases if a neutral is not available. This operation requires additional sets of switches on the lower terminal of the Module. In addition the complexity and component count is increased, however some system advantages may be realized. Finally, it is understood that several of such modules may be operated in parallel with some modules specifically designed for dedicated operation and operating between dedicated phases.

The operation described in this VAR generator section did only use the TPCS front end as a capacitor. In fact for simple VAR correction the TPCS voltage step-up operation is not required and a simple capacitor can be used in its place. This front end mode of operation can be used not only for the VAR generation but can be extended to the other operation described in this specification. Without the TPCS step-up or step-down use I can still synthesize single or polyphase AC output, DC output or output of other waveforms. The input may be from an AC grid or from a DC source. The limitation is in the output voltage range only. Without the TPCS an output of the same or reduced voltage level is most practical.

Inductive Energy Storage

The basic TPCS allows a complete electrical disconnection between the input and the output. This reliable high voltage "Opening Switch" function is the missing ingredient for practical inductive energy storage.

As many studies have shown, inductive energy storage requires much less weight, volume, and is significantly lower in capital cost. The implementation of the TPCS as an opening or disconnect switch allows the practical implementation of such an inductive energy storage system.

Figure 11:
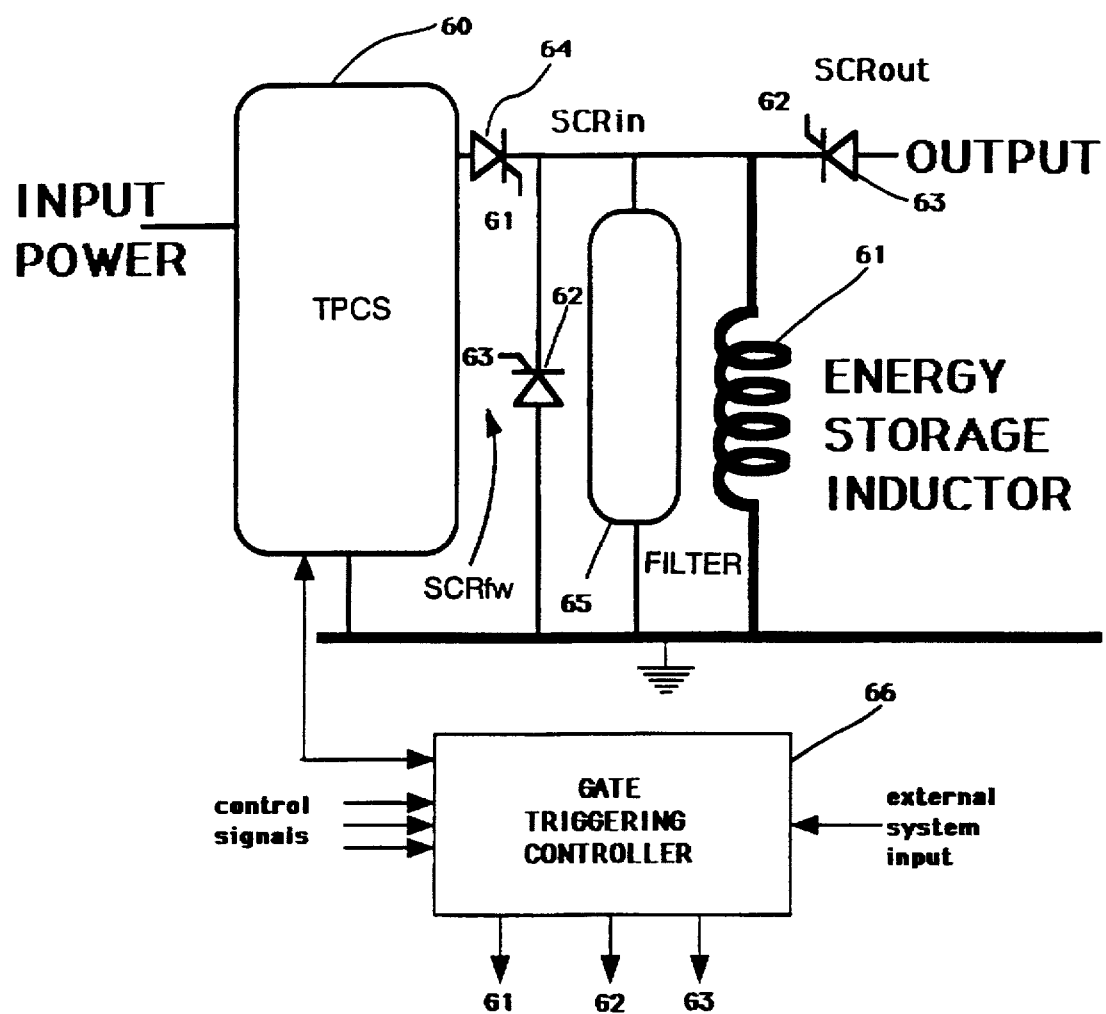
FIG. 11 is a simplified electrical configuration for one TPCS module in conjunction with an inductor for magnetic energy storage and retrieval.

FIG. 11 is a simplified schematic for a TPCS magnetic energy storage assembly 60 that allows the controlled build-up of a large current and inductive energy in an inductor 61 from a power source. With two or more TPCS modules the charging can be effectively continuous. In addition a free wheeling switch ($SCR_{fw}$) 62 can be used to circulate the current during the short TPCS recharge period. The free wheeling SCR is turned off every time the TPCS module is injecting energy into the inductor.

With energy build up to the desired value the TPCS charging system is stopped and the output switch ($SCR_{out}$) 63 is turned on to extract the magnetically stored energy. At this point the TPCS, connected through the $SCR_{in}$ 64 to the inductor represents a small and discharged capacitor bank. In addition this bank will become completely isolated from the inductor as soon as the $SCR_{in}$ is reverse biased. If the output interface circuit is properly designed, the output can be stopped with a new charge injection from the TPCS charging module into the inductor as long as the TPCS instantaneously injected current is larger than the output current. This will back-bias the output $SCR_{out}$ assembly and turn it off. At this point the new inductor charging cycle is started. A filtering network 65 may be added for component protection.

The system is controlled by gate trigger controller. It receives the external operational requirements, in and output conditions, and generates the switch trigger signals.

Reliability Impact of the TPCS

A solid state stack failure in a standard inverter or converter will either cause a direct AC phase to phase or direct DC line short. A similar component failure in a TPCS inverter or converter will not cause the same catastrophic failures and requires much less protection and fault clearing equipment. In the basic TPCS operation either a relative small capacitor is being charged from a line or discharged into a line. A short of a solid state stack will not cause a major inrush current and can be cleared much more readily. With several TPCS modules operating in parallel the defective module can be isolated and the remaining units can remain operational with only a reduction of the maximum power throughput. Repairs can then be scheduled for the appropriated time.

The operation of the basic TPCS are in three basic steps, i.e. charging the capacitors, inverting the TPCS capacitor chain, and discharging the inverted chain. A step is typically completed before the next is being initiated. If a failure is detected and the sequence is interrupted no short current will flow from the input to the output. At that point the system can be isolated without the use of high power air blast switchgear. This is especially beneficial on the DC side, since DC faults are much more difficult to clear. In fact TPCS AC to AC transformation unit, AC to DC converter, and DC to AC inverter can be each used as an effective high power and high voltage interrupter. In addition the basic operation of any described TPCS device has a maximum power throughput and can not be overloaded. The TPCS can be used as an effective power or current limiting device.

Although the invention is described with respect to a preferred embodiment, modifications thereto will be apparent to those skilled in the art. Therefore, the scope of the invention is to be determined by reference to the claims which follow.

I claim as my invention:

1. An electrical power transfer apparatus for connecting to a power line carrying an AC signal having a period of $T_{AC}$, said apparatus comprising:

a capacitive storage circuit;

a charge transfer circuit connected to the capacitive storage circuit which during operation resonantly transfers power from the power line to the capacitive storage during a power extraction phase of operation and resonantly transfers power from the capacitive storage circuit to the power line during a power injection phase of operation, wherein the resonant transfers of power to and from the capacitive charge storage circuit occur with a resonant frequency at least as great as $1/T_{AC}$; and a control circuit coupled to the power transfer circuit and which during operation causes the power transfer circuit to perform a sequence of power extraction and power injection phases of operation.

2. The electrical power transfer apparatus of claim 1 wherein the power transfer circuit comprises a charge extraction circuit and a charge injection circuit, both of which are connected to the capacitive storage circuit.

3. The electrical power transfer apparatus of claim 2 wherein the charge injection circuit comprises a unidirectional switch and an inductor and wherein during operation the control circuit operates the unidirectional switch to perform the power injection phase.

4. The electrical power transfer apparatus of claim 2 wherein the charge extraction circuit comprises a unidirectional switch and an inductor and wherein during operation the control circuit operates the unidirectional switch to perform the power extraction phase.

5. An electrical power transfer apparatus for connecting to a multiphase power line carrying a AC signal having a period of $T_{AC}$, said apparatus comprising:

a capacitive storage circuit;

a plurality of charge transfer circuits connected to the capacitive storage circuit and each of which is connected to a different phase of the multiphase power line, wherein during operation said plurality of charge transfer circuits resonantly transfer power to and from the multiphase power line and capacitive storage circuit, wherein the resonant transfers to and from the capacitive charge storage circuit occur with a resonant frequency at least as great as $1/T_{AC}$; and a control circuit coupled to the plurality of charge transfer circuits and which during operation causes the plurality of charge transfer circuits to transfer power between different phases of the multiphase power line via the capacitive storage circuit.

6. The electrical power transfer apparatus of claim 5 wherein said plurality of charge transfer circuits comprises:

a plurality of charging circuits each of which during operation couples a different phase of said multiphase AC power line to said capacitive storage circuit to transfer power from that phase to the capacitive storage circuit; and a plurality of injecting circuits each of which during operation couples said capacitive storage circuit to a different corresponding one of said phases of said multiphase power line to transfer power from said capacitive storage circuit into the phase to which it is coupled.

7. The electrical power transfer apparatus of claim 6 wherein each of said plurality of injecting circuits comprises a unidirectional switch and an inductor which is electrically coupled to the capacitive storage circuit.

8. The electrical power transfer apparatus of claim 7 wherein control circuit is connected to operate the unidirectional switches of the plurality of injecting circuits to resonantly transfer power from the capacitive storage circuit to the power line.

9. The electrical power transfer apparatus of claim 7 wherein each of said plurality of injecting circuits when coupled to said capacitive storage circuit forms a corresponding resonant circuit having a resonant frequency of $1/T_i$, where i is an index identifying the injecting circuit and wherein $T_i$ are all less than $T_{AC}$.

10. The electrical power transfer apparatus of claim 6 wherein each of said plurality of charging circuits comprises a unidirectional switch and an inductor which is electrically coupled to the capacitive storage circuit.

11. The electrical power transfer apparatus of claim 10 wherein control circuit is connected to operate the unidirectional switches of the plurality of charging circuits to resonantly transfer power from the power line to the capacitive storage circuit.

12. The electrical power transfer apparatus of claim 11 wherein each of said plurality of injecting circuits comprises a unidirectional switch and an inductor which is electrically coupled to the capacitive storage circuit.

13. The electrical power transfer apparatus of claim 12 wherein control circuit is connected to operate the unidirectional switches of the plurality of injecting circuits to resonantly transfer power from the capacitive storage circuit to the power line.

14. The electrical power transfer apparatus of claim 12 wherein the control circuit during operation operates the unidirectional switches of said plurality of charging circuits and the unidirectional switches of said plurality of injecting circuits so as to transfer charge from one phase of the multiphase power line through said capacitive storage unit to another phase of said multiphase power line.

15. The electrical power transfer apparatus of claim 10 wherein each of said plurality charging circuits when coupled to said capacitive storage circuit forms a corresponding resonant circuit having a resonant frequency of $1/T_i$, where i is an index identifying the charging circuit and wherein $T_i$ are all less than $T_{AC}$.

16. A method for transferring power to and from a power line which carries AC power having a cycle with a period of $T_{AC}$, said method comprising:

resonantly extracting power from the power line into a capacitive storage circuit at a resonant frequency that is greater than $1/T_{AC}$;

resonantly injecting power from the capacitive storage circuit into the power line at a resonant frequency that is greater than $1/T_{AC}$; and repeating the steps of resonantly extracting and injecting power from and to the power line multiple times per cycle.

17. The method of claim 16 wherein the step of resonantly injecting power comprises electrically coupling an inductive circuit between the power line and the charge storage circuit, wherein said inductive circuit when electrically coupled with the capacitive storage circuit produces a circuit having a resonance frequency that is greater than $1/T_{AC}$.

18. The method of claim 16 wherein the step of resonantly extracting power comprises electrically coupling an inductive circuit between the power line and the charge storage circuit, wherein said inductive circuit when electrically coupled with the capacitive storage circuit produces a circuit having a resonance frequency that is greater than $1/T_{AC}$.

* * * * *